United States Patent
Sudhakaran et al.

(10) Patent No.: US 12,347,508 B2
(45) Date of Patent: Jul. 1, 2025

(54) ERROR DETECTION PIN ENCODING SCHEME TO AVOID MAXIMUM TRANSITIONS AND FURTHER IMPROVE SIGNAL INTEGRITY ON HIGH SPEED GRAPHIC MEMORY INTERFACES

(71) Applicant: NVIDIA Corp., Santa Clara, CA (US)

(72) Inventors: Sunil Sudhakaran, Brisbane, CA (US); Gautam Bhatia, San Mateo, CA (US); Robert Bloemer, Sterling, MA (US)

(73) Assignee: NVIDIA Corp., Santa Clara, CA (US)

( * ) Notice: Subject to any disclaimer, the term of this patent is extended or adjusted under 35 U.S.C. 154(b) by 611 days.

(21) Appl. No.: 17/670,226

(22) Filed: Feb. 11, 2022

(65) Prior Publication Data

US 2022/0262447 A1    Aug. 18, 2022

Related U.S. Application Data

(60) Provisional application No. 63/149,103, filed on Feb. 12, 2021.

(51) Int. Cl.
*G11C 29/02* (2006.01)
*G11C 29/12* (2006.01)
(Continued)

(52) U.S. Cl.
CPC ...... *G11C 29/025* (2013.01); *G11C 29/12005* (2013.01); *G11C 29/1201* (2013.01);
(Continued)

(58) Field of Classification Search
CPC ............ G11C 29/025; G11C 29/12005; G11C 29/1201; G11C 29/42; G11C 29/4401;
(Continued)

(56) References Cited

U.S. PATENT DOCUMENTS 4,623,223 A   11/1986   Kempf
4,667,337 A    5/1987   Fletcher
(Continued)

FOREIGN PATENT DOCUMENTS

DE   102019108205 A1   10/2019
DE   102019118340 A1    1/2020
(Continued)

OTHER PUBLICATIONS 10 2019 107 849.0_DPMA_Office Action Dated Aug. 11, 2021.
(Continued)

*Primary Examiner* — Betsy Deppe
(74) *Attorney, Agent, or Firm* — Carnelian Law, LLC

(57) ABSTRACT

First symbols are generated on a plurality of data channels by applying PAM-N encoding on a first subset of bits of a data burst, the first symbols generated without maximum transitions; second symbols are generated on at least one optionally-activated additional data channel, the second symbols generated by applying the PAM-N encoding on a second subset of bits of the data burst, the second symbols generated without maximum transitions; and third symbols are generated on a channel for communicating error correction bits for the first bits and second bits, the third symbols generated by applying hybrid PAM-N encoding on the error correction bits and a third subset of bits of the data burst, the hybrid PAM-N encoding comprising an interleaving of symbols with N voltage levels and symbols with less than N voltage levels.

25 Claims, 16 Drawing Sheets

(51) Int. Cl.
  *G11C 29/42* (2006.01)
  *G11C 29/44* (2006.01)
  *H03K 19/00* (2006.01)
  *H03M 5/20* (2006.01)
  *H04L 1/00* (2006.01)
  *H04L 25/49* (2006.01)

(52) U.S. Cl.
  CPC .......... *G11C 29/42* (2013.01); *G11C 29/4401* (2013.01); *H03K 19/0005* (2013.01); *H03M 5/20* (2013.01); *H04L 1/0041* (2013.01); *H04L 25/4917* (2013.01)

(58) Field of Classification Search
  CPC ... H04L 25/4917; H04L 1/004; H04L 1/0041; H04B 3/00; H04B 3/02; H03K 7/02; H03M 13/09; H03M 13/27; H03M 5/20
  See application file for complete search history.

(56) References Cited

U.S. PATENT DOCUMENTS

| | | | |
|---|---|---|---|
| 4,739,323 A | 4/1988 | Miesterfeld et al. | |
| 4,742,349 A | 5/1988 | Miesterfeld et al. | |
| 5,377,020 A | 12/1994 | Smitt | |
| 5,487,665 A | 1/1996 | Lechner et al. | |
| 5,572,736 A | 11/1996 | Curran | |
| 5,833,340 A | 11/1998 | Yoshikawa et al. | |
| 5,856,980 A | 1/1999 | Doyle | |
| 5,890,005 A | 3/1999 | Lindholm | |
| 6,046,943 A | 4/2000 | Walker | |
| 6,285,300 B1 | 9/2001 | Colon-Bonet | |
| 6,335,718 B1 | 1/2002 | Hong et al. | |
| 6,348,915 B1 | 2/2002 | Yamashita et al. | |
| 6,400,633 B1 | 6/2002 | Al-Shamma et al. | |
| 6,442,077 B2 | 8/2002 | Shin | |
| 6,489,900 B2 | 12/2002 | Shin et al. | |
| 6,604,120 B1 | 8/2003 | De | |
| 6,717,990 B1 | 4/2004 | Abousleman | |
| 6,877,050 B2 | 4/2005 | Kanzaki et al. | |
| 7,022,736 B2 | 4/2006 | Neuner et al. | |
| 7,061,408 B2 | 6/2006 | Poechmueller | |
| 7,082,489 B2 | 7/2006 | Yeh et al. | |
| 7,135,996 B1 | 11/2006 | Lo et al. | |
| 7,149,955 B1 | 12/2006 | Sutardja et al. | |
| 7,188,263 B1 | 3/2007 | Rubinstein et al. | |
| 7,356,632 B2 | 4/2008 | Yeh et al. | |
| RE40,864 E | 7/2009 | Hong et al. | |
| 7,620,116 B2 | 11/2009 | Bessios et al. | |
| 7,782,682 B2 | 8/2010 | Matsuzaki et al. | |
| 8,022,726 B2 | 9/2011 | Candage et al. | |
| 8,022,736 B2 | 9/2011 | Chang et al. | |
| 8,181,101 B2 | 5/2012 | Shen et al. | |
| 8,189,263 B1 | 5/2012 | Wang et al. | |
| 8,359,498 B1 | 1/2013 | Sutardja et al. | |
| 8,984,380 B2 | 3/2015 | Vijayaraghavan et al. | |
| 9,184,906 B1 | 11/2015 | Min et al. | |
| 9,231,704 B1 | 1/2016 | Zhou et al. | |
| 9,240,907 B2 | 1/2016 | Wang | |
| 9,244,763 B1 | 1/2016 | Kankani et al. | |
| 9,548,858 B1 | 1/2017 | Cirit et al. | |
| 9,564,990 B1 | 2/2017 | Tiruvur et al. | |
| 9,853,769 B1 | 12/2017 | Farjad et al. | |
| 9,942,063 B2 | 4/2018 | Mendel | |
| 9,978,171 B2 | 5/2018 | Bolz et al. | |
| 10,312,896 B2 | 6/2019 | Kim et al. | |
| 10,424,074 B1 | 9/2019 | Uralsky et al. | |
| 10,491,238 B2* | 11/2019 | Sudhakaran ......... | H03M 5/145 |
| 10,491,435 B2 | 11/2019 | Lee et al. | |
| 10,581,645 B1 | 3/2020 | Song et al. | |
| 10,599,606 B2 | 3/2020 | Lee et al. | |
| 10,657,094 B2 | 5/2020 | Lee et al. | |
| 10,657,306 B1 | 5/2020 | Ma et al. | |
| 10,699,427 B2 | 6/2020 | Uralsky et al. | |
| 10,979,176 B1 | 4/2021 | Sudhakaran et al. | |
| 2003/0035497 A1 | 2/2003 | Gorecki et al. | |
| 2003/0076718 A1 | 4/2003 | Rolandi | |
| 2003/0108134 A1 | 6/2003 | Stonick et al. | |
| 2004/0114692 A1 | 6/2004 | Matsumoto | |
| 2004/0153318 A1 | 8/2004 | Chamberlain | |
| 2005/0086417 A1 | 4/2005 | Meyer et al. | |
| 2005/0089126 A1 | 4/2005 | Zerbe et al. | |
| 2005/0099325 A1 | 5/2005 | Bessios | |
| 2005/0185281 A1 | 8/2005 | Perlin et al. | |
| 2006/0109917 A1 | 5/2006 | Fonseka et al. | |
| 2006/0139186 A1 | 6/2006 | Hoyer | |
| 2006/0280272 A1 | 12/2006 | Stojanovic | |
| 2007/0203962 A1 | 8/2007 | Hirairi | |
| 2008/0181331 A1 | 7/2008 | Casper et al. | |
| 2008/0262855 A1 | 10/2008 | Mehrotra et al. | |
| 2009/0193319 A1 | 7/2009 | Shen et al. | |
| 2009/0323722 A1 | 12/2009 | Sharma | |
| 2010/0174844 A1 | 7/2010 | Chu | |
| 2010/0214138 A1 | 8/2010 | Hollis | |
| 2010/0299440 A1 | 11/2010 | Meyer et al. | |
| 2011/0264719 A1 | 10/2011 | Mortensen | |
| 2012/0110255 A1 | 5/2012 | Meyer et al. | |
| 2012/0144161 A1 | 6/2012 | Elliott | |
| 2012/0204082 A1 | 8/2012 | Shen et al. | |
| 2012/0206280 A1 | 8/2012 | Abbasfar et al. | |
| 2012/0250746 A1 | 10/2012 | Sonntag | |
| 2013/0226982 A1 | 8/2013 | Yu | |
| 2014/0153620 A1 | 6/2014 | Longo et al. | |
| 2014/0173296 A1 | 6/2014 | Muff et al. | |
| 2014/0281075 A1 | 9/2014 | Hollis | |
| 2014/0298458 A1 | 10/2014 | Lewis et al. | |
| 2014/0358979 A1 | 12/2014 | Singh | |
| 2015/0137789 A1 | 5/2015 | Furtner | |
| 2015/0235634 A1 | 8/2015 | Liu et al. | |
| 2016/0013958 A1 | 1/2016 | Mishra et al. | |
| 2016/0164705 A1 | 6/2016 | Whitby-Strevens | |
| 2016/0173134 A1 | 6/2016 | Kwon et al. | |
| 2016/0373557 A1 | 12/2016 | Sikkink et al. | |
| 2017/0075854 A1 | 3/2017 | Hollis | |
| 2017/0207908 A1 | 7/2017 | Cirit et al. | |
| 2017/0220518 A1 | 8/2017 | Sengoku et al. | |
| 2017/0272285 A1 | 9/2017 | Shokrollahi et al. | |
| 2017/0310529 A1 | 10/2017 | Yang et al. | |
| 2017/0373887 A1 | 12/2017 | Ho | |
| 2018/0091189 A1 | 3/2018 | Chada et al. | |
| 2018/0091335 A1 | 3/2018 | Schnizler | |
| 2018/0123839 A1 | 5/2018 | Chung et al. | |
| 2019/0199560 A1 | 6/2019 | Bossard et al. | |
| 2019/0303340 A1 | 10/2019 | Lee et al. | |
| 2019/0305765 A1 | 10/2019 | Lee et al. | |
| 2019/0305995 A1 | 10/2019 | Lee et al. | |
| 2020/0050923 A1 | 2/2020 | Patney et al. | |
| 2020/0151289 A1 | 5/2020 | Sikka et al. | |
| 2020/0159437 A1* | 5/2020 | Walker ................. | G06F 3/0647 |
| 2020/0175392 A1 | 6/2020 | Tang et al. | |
| 2020/0210276 A1 | 7/2020 | Sullivan et al. | |
| 2020/0210805 A1 | 7/2020 | Drozdowski et al. | |
| 2021/0012825 A1 | 1/2021 | Martinelli et al. | |
| 2021/0105023 A1 | 4/2021 | Cornelius et al. | |

FOREIGN PATENT DOCUMENTS

| | | |
|---|---|---|
| DE | 102019123711 A1 | 3/2020 |
| EP | 3167579 B1 | 6/2018 |
| KR | 20010065770 A | 7/2001 |
| KR | 100321164 B1 | 3/2002 |
| WO | 2015077606 A1 | 5/2015 |

OTHER PUBLICATIONS 10 2019 108 205.6 DPMA Office Action Dated Aug. 10, 2021.
Acquaviva, Andrea, et al., A Spatially-Adaptive BusInterface for Low-Switching Communication, ISLPED '00, pp. 238-240, Rapallo, Italy., Feb. 2020.
AN 835 PAM4 Signaling Fundamentals by INTEL 03122019, (Mar. 12, 2019).

(56) References Cited

OTHER PUBLICATIONS

Arnold, J.S., et al., Design of tightly-coupled multiprocessing programming, IBM Systems Journal, vol. 13 , Issue: 1, pp. 60-87, 1974.
Baek, Kwang-Hyun, et al., A Low Energy Encoding Technique for Reduction of Coupling Effects in SoC Interconnects, Proc. 43rd IEEE Midwest Symp. on Circuits and Systems, pp. 80-83, Lansing MI. Aug. 11, 2000.
Benini, Luca, et al., Address Bus Encoding Techniques for System-Level Power Optimization, Proceedings Design, Automation and Test in Europe, IEEE, Paris, France, Feb. 1998.
Benini, Luca, et al., Asymptotic Zero-Transition Activity Encoding for Address Busses in Low-Power Microprocessor-Based Systems, Proceedings Great Lakes Symposium on VLSI, IEEE, Urbana-Champaign, IL, USA, pp. 77-82, Mar. 1997.
Benini, Luca, et al., Power Optimization of Core-Based Systems by Address Bus Encoding, IEEE Transactions on Very Large Scale Integration (VLSI) Systems, vol. 6, No. 4, Dec. 1998, pp. 554-562.
Benini, Luca, et al., System-Level Power Optimization: Techniques and Tools, ISLPED99, San Diego, CA, USA, 1999, pp. 288-293.
Bishop, Benjamin, et al., A Low-Energy Adaptive Bus Coding Scheme, Proceedings IEEE Computer Society Workshop on VLSI 2001. Emerging Technologies for VLSI Systems, Orlando, FL, USA, Apr. 2001, pp. 118-122.
Campbell, John E., et al., Design Considerations for a VLSI Microprocessor, IBM J. Res. Develop. vol. 26 No. 4,. Jul. 1982, pp. 454-463.
Canegallo, Roberto, et al., Low Power Techniques for FLASH Memories, ISCAS 2001. The 2001 IEEE International Symposium on Circuits and Systems (Cat. No. 01CH37196), May 2001, Sydney, NSW, Australia, IV-494-IV497.
Catthoor, F., et al., Global Communication and Memory Optimizing Transformations for Low Power Signal Processing Systems, Proceedings of 1994 IEEE Workshop on VLSI Signal Processing, La Jolla, CA, USA, Oct. 1994, pp. 178-187.
Chandrakasan, Anantha P., et al., A Low-Power Chipset for a Portable Multimedia I/O Terminal, IEEE Journal of Solid-State Circuits. vol. 29, No. 12, Dec. 1994, pp. 1415-1428.
Chandrakasan, Anantha P., et al., Low-Power CMOS Digital Design, IEEE Journal of Solid-State Circuits. vol. 27, No. 4. Apr. 1992, pp. 473-484.
Chandrakasan, Anantha P., et al., Minimizing Power Consumption in Digital CMOS Circuits, Proceedings of the IEEE, vol. 83, No. 4, Apr. 1995, pp. 498-523.
Chandrakasan, Anantha P., et al., Optimizing Power Using Transformations, IEEE Transactions on Computer-Aided Design of Integrated Circuits and Systems, vol. 14, No. 1, Jan. 1995, pp. 12-31.
Chang, Naehyuck, et al., Bus Encoding for Low-Power High-Performance Memory Systems, DAC '00: Proceedings of the 37th Annual Design Automation Conference, Jun. 2000, pp. 800-805.
Chang, Naehyuck, et al., Dual-Mode Low-Power Bus Encoding for High-Performance Bus Drivers, Conference: TENCON 99. Proceedings of the IEEE Region 10 Conference, vol. 2, Jan. 2000, pp. 876-879.
Chang, You-Sung, et al., Conforming Inverted Data Store for Low Power Memory, Proceedings. 1999 International Symposium on Low Power Electronics and Design (Cat. No. 99TH8477), Aug. 1999, San Diego, CA, USA.
Chao, H.H., et al., Designing the Micro370, IEEE Design & Test, Jun. 1987, pp. 32-40.
Chatterjee, Pallab, ULSI CMOS—The Next Ten years, Microelectronic Engineering 19 (1992), pp. 3-8.
Cheng, Wei-Chung, et al., Memory Bus Encoding for Low Power: A Tutorial, Proceedings of the IEEE 2001. 2nd International Symposium on Quality Electronic Design, Mar. 2001, San Jose, CA, USA, pp. 199-204.
Cheng, Wei-Chung, et al., Power-Optimal Encoding for DRAM Address Bus, ISLPED '00: Proceedings of the 2000 international symposium on Low power electronics and design, Aug. 2000, pp. 250-252.
Chou, Tan-Li, et al., Estimation of Circuit Activity Considering Signal Correlations and Simultaneous Switching, IEEE/ACM International Conference on Computer-Aided Design, Nov. 1994, pp. 300-303.
De Angel, Edwin, et al., Survey of Low Power Techniques for VLSI Design, Innovative Systems in Silicon Conference Session 6: Analog and Low Power Electronics, 1996, pp. 159-169.
Donaldson, Darrel D., et al., SNOS 1K x 8 Static Nonvolatile RAM, IEEE Journal of Solid-State Circuits, vol. SC-17, No. 5, Oct. 1982, pp. 847-851.
Elliott, R.C., Managed Load Distribution, INTELEC '81—Third International Telecommunications Energy Conference, pp. 50-55.
Elpida, 128M bits Self Terminated Interface DDR SDRAM, Preliminary Datasheet Ver. 1.0, Jul. 2002.
Ewen, J. F., et al., CMOS circuits for GB/s serial data communication, IBM J. Res. Develop. vol. 39 No. 1/2 Jan./Mar. 1995, pp. 73-81.
Fagan, John L., et al., A 16-kbit Nonvolatile Charge Addressed Memory, IEEE Journal of Solid-State Circuits, vol. SC-11, No. 5, Oct. 1976, pp. 631-636.
Fornaciari, William, et al., Influence of Caching and Encoding on Power Dissipation of System-Level Buses for Embedded Systems, Design, Automation and Test in Europe Conference and Exhibition, 1999. Proceedings (Cat. No. PR00078), Mar. 1999, Munich, Germany.
Givargis, Tony D., et al., Interface and Cache Power Exploration for Core-Based Embedded System Design, 1999 IEEE/ACM International Conference on Computer-Aided Design. Digest of Technical Papers (Cat. No. 99CH37051), Nov. 1999, pp. 270-273.
Green, J.H., et al., Line-Protection Switching, The Bell System Technical Journal, vol. 53, No. 10, Dec. 1974, USA, pp. 2011-2034.
Hakenes, Rolf, et al., A Segmented Gray Code for Low-Power Microcontroller Address Buses, Proceedings 25th Euromicro Conference. Informatics: Theory and Practice for the New Millennium, Sep. 1999, Milan, Italy.
Harboe-Sørensen, R., et al., Radiation Pre-screening of 4 Mbit Dynamic Random Access Memories for Space Application, RADECS 91 First European Conference on Radiation and its Effects on Devices and Systems, Sep. 1991, La Grande-Motte, France, pp. 489-504.
Harris, Erik P., et al., Technology Directions for Portable Computers, Proceedings of the IEEE, vol. 83, No. 4, Apr. 1995, pp. 636-658.
Hirsch, Donald J., Computer Communications Interface Devices for Tactical C3, MILCOM 1986—IEEE Military Communications Conference: Communications—Computers: Teamed for the 90's, Oct. 1986, pp. 5.4.1-5.4.5.
Hong, Sungpack, et al., Bus-Invert Coding for Low-Power IO—A Decomposition Approach, hoc. 43rd IEEE Midwest Symp. on Circuits and Systems, Lansing MI, Aug. 8-11, 2000, pp. 750-753.
Hossain et al, Channel-Adaptive ADC and TDC for 28 GB/s PAM-4 Digital Receiver, (Mar. 2018).
Hossain, Rozak, et al., Low Power via Reduced Switching Activity and its Application to PLAs, pp. 100-103.
Hoyme, Kenneth, et al., SAFEbus, Proceedings IEEE/AIAA 11th Digital Avionics Systems Conference, Oct. 1992, Seattle, WA, USA, pp. 68-73.
Hsieh, Cheng-Ta, et al., Architectural Power Optimization by Bus Splitting, Proceedings Design, Automation and Test in Europe Conference and Exhibition 2000 (Cat. No. PR00537), Mar. 2000, Paris, France.
Iizuka, Tetsuya, Substrate-fed CMOS Memory Device, 1978 International Electron Devices Meeting, Dec. 1978, Washington, DC, USA, pp. 222-226.
Im et al, A 40-to-56 GB/s PAM-4 Receiver With Ten-Tap Direct Decision-Feedback Equalization in 16-nm FinFET.
Irwin, Mary Jane, et al., Energy Issues in Multimedia Systems, 1999 IEEE Workshop on Signal Processing Systems. SiPS 99. Design and Implementation (Cat. No. 99TH8461), Oct. 1999, Taipei, Taiwan, pp. 24-33.
Khandelwal et al. DesignCon 2016 Year 2016, 100Gbps Dual-Channel PAM-4 transmission over Datacenter Interconnects.

(56) References Cited

OTHER PUBLICATIONS

Kim, Kyeounsoo, et al., An Efficient Frame Memory Intci-face of MPEG-2 Vidco Encoder ASIC Chip, IEEE Transaclions on Consumer Electronics, vol. 45, No. 3, Aug. 1999, pp. 507-514.
www.edaboard.com, how to make an 8-3 encoder using 4-2 encoders, Jul. 2010, pp. 1-4 (Year: 2010).
www.electronics-tutorials.ws, binary decoder, Feb. 2014, pp. 1-5 (Year: 2014).
Yang, Jun, et al., FV Encoding for Low-Power Data I/O, ISLPED'01: Proceedings of the 2001 International Symposium on Low Power Electronics and Design (IEEE Cat. No. 01TH8581), Aug. 2001, Huntington Beach, CA, USA, pp. 84-87.
Office Action China Patent Office Jun. 5, 2023.
Office Action China Patent Office Jun. 8, 2023.

\* cited by examiner

| | d[0:1] | d[2:3] | d[4:5] | d[6:7] | d[8:9] | d[10:11] | d[12:13] | d[14:15] |
|---|---|---|---|---|---|---|---|---|
| DQ[0] | d0[0] | d0[7:1] | | | d0[8] | d0[15:9] | | |
| DQ[1] | d1[0] | d1[7:1] | | | d1[8] | d1[15:9] | | |
| DQ[2] | d2[0] | d2[7:1] | | | d2[8] | d2[15:9] | | |
| DQ[3] | d3[0] | d3[7:1] | | | d3[8] | d3[15:9] | | |
| DQ[4] | d4[0] | d4[7:1] | | | d4[8] | d4[15:9] | | |
| DQ[5] | d5[0] | d5[7:1] | | | d5[8] | d5[15:9] | | |
| DQ[6] | d6[0] | d6[7:1] | | | d6[8] | d6[15:9] | | |
| DQ[7] | d7[0] | d7[7:1] | | | d7[8] | d7[15:9] | | |

RAW DATA 402

| | S[0] | S[1] | S[2] | S[3] | S[4] | S[5] | S[6] | S[7] |
|---|---|---|---|---|---|---|---|---|
| DQ[0] | c0[7:0] | | | | c0[15:8] | | | |
| DQ[1] | c1[7:0] | | | | c1[15:8] | | | |
| DQ[2] | c2[7:0] | | | | c2[15:8] | | | |
| DQ[3] | c3[7:0] | | | | c3[15:8] | | | |
| DQ[4] | c4[7:0] | | | | c4[15:8] | | | |
| DQ[5] | c5[7:0] | | | | c5[15:8] | | | |
| DQ[6] | c6[7:0] | | | | c6[15:8] | | | |
| DQ[7] | c7[7:0] | | | | c7[15:8] | | | |
| DQX | d0[0] d0[8] | d1[0] d1[8] | d2[0] d2[8] | d3[0] d3[8] | d4[0] d4[8] | d5[0] d5[8] | d6[0] d6[8] | d7[0] d7[8] |

ENCODED DATA 404

FIG. 4

ERROR DETECTION PIN ENCODING SCHEME TO AVOID MAXIMUM TRANSITIONS AND FURTHER IMPROVE SIGNAL INTEGRITY ON HIGH SPEED GRAPHIC MEMORY INTERFACES

CROSS REFERENCE TO RELATED APPLICATIONS

This application claims priority and benefit under 35 USC 119(e) to U.S. application Ser. No. 63/149,103, titled "Error Detection Pin Encoding Scheme to Avoid Maximum Transitions and Further Improve Signal Integrity on High Speed Graphic Memory Interfaces", filed on Feb. 12, 2021, the contents of which are incorporated herein by reference in their entirety.

BACKGROUND

Pulse amplitude modulation (PAM) encoding may be utilized to increase communication bandwidth between system components such as memory circuits (e.g., graphics memory circuits), central processing units (CPUs), and graphics processing units (GPUs). One type of PAM encoding is PAM-4, which utilized four voltage levels per symbol. Due to its use of more than two voltage levels to encode symbols each representing multiple bits, PAM-4 is more susceptible to noise introduced from inter-symbol interference and crosstalk than are binary voltage level techniques such as PAM-2.

Inter-symbol interference (ISI) is a form of distortion of a signal in which one symbol interferes with subsequent symbols. This is an disruptive phenomenon as the previous symbols have a similar effect as noise, thus making the communication less reliable.

Crosstalk is any phenomenon by which a signal transmitted on one circuit or channel of a transmission system creates an undesired effect in another circuit or channel. Crosstalk is usually caused by undesired capacitive, inductive, or conductive coupling from one circuit or channel to another.

Crosstalk and ISI effects may increase due to maximum voltage transitions between PAM encoded symbols communicated closely in time. Maximum transition avoiding (MTA) techniques may be utilized to mitigate these effects. There is an ongoing need to improve and/or adapt MTA techniques for this purpose in various electronic systems and circuits, for example for use with high-speed memory busses.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

FIG. 4 depicts an embodiment of a 7-8 bit encoding 400.

DETAILED DESCRIPTION

Figure 1:
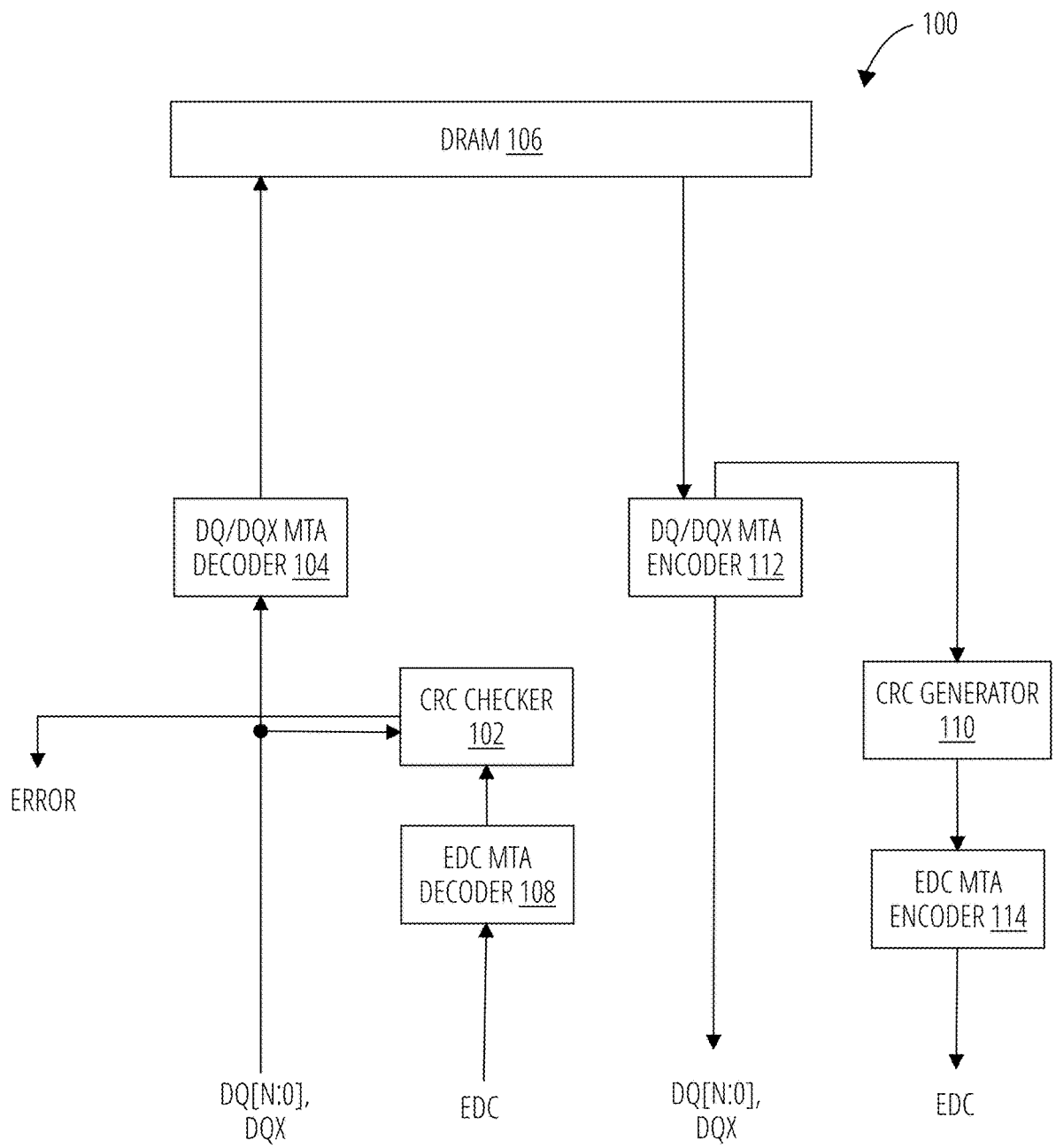
FIG. 1 depicts a machine memory system 100 in accordance with one embodiment.

The following description refers to particular pins of a memory bus. One type of memory that may utilize these pins is a GDDR SDRAM (Graphics Double Data Rate Synchronous Dynamic Random-Access Memory), a type of synchronous graphics random-access memory (SGRAM) with a high bandwidth interface designed for use in graphics cards, game consoles, and high-performance computing.

Each pin provides a communication channel named for the pin. Therefore in the following description pin names may also be understood to refer to channels of the same name, and vice-versa. Also, the term "pin" should be understood to generally mean an ingress or egress point of signals from a circuit (that may be internal to a package), not necessarily an external pin on a circuit package. Table 1 below provides names for particular pins/channels discussed below and a description of their purpose in operation.

TABLE 1

| | |
|---|---|
| DQ[N:0] | Data Input/Output Pins (data channels) for N parallel Bits |
| DQX | Data Input/Output Extension Pin. The DQX pin/channel is optionally activated and utilized only in high-speed mode with MTA enabled. |
| EDC | Error Detection Code Pin. Inter-alia, calculated CRCs for the data transmitted on the DQ and DQX pins are transmitted on the EDC pin/channel |

In a high speed mode of operation, a memory (e.g., a GDDR SGRAM) may utilize an embodiment of PAM-4 encoding to send two bits on information on each data channel (DQ[N:0] and DQX) every symbol time (i.e., unit interval—UI). A hybrid PAM-4 encoding may be utilized to send CRC and additional data on the EDC channel. Table 2 below depicts a symbol encoding for the various channels in one embodiment comprising eight (8) DQ channels, a DQX channel, and an EDC channel.

TABLE 2

| Symbol | Logical Value | | | Voltage level |
|---|---|---|---|---|
| | DQ7-0, DQX | EDC (even UI) | EDC (odd UI) | |
| +3 | 10 | 10 | — | 0.500 VDDQ |
| +1 | 11 | 11 | 1 | 0.333 VDDQ |
| −1 | 01 | 01 | 0 | 0.166 VDDQ |
| −3 | 00 | 00 | | VSSQ |

In Table 2, the least significant bit (LSB) of the logical value of a symbol represents the first bit encoded in the symbol and the most significant bit (MSB) represents the second bit encoded in the symbol. A 32 bit burst of PAM-4 encoded data may be read from the memory, or written to the memory, in a time of 16 unit intervals. During reading and writing of data bursts, the memory may utilize MTA to mitigate crosstalk and simultaneous switching noise arising from +3 to −3 and −3 to +3 transitions on the DQ, DQX, and EDC channels.

Certain terms are used herein and should be understood as follows. Other terms used herein should be accorded their ordinary meaning in the art or understood in the context they are provided.

"Auxiliary data channel" refers to a channel, which may be one or more conductors, that is engaged only in certain communication modes, typically modes of higher-speed communication than a base-level mode. An auxiliary data channel is distinguished from other types of data channels by the fact that it is optional to data communications and not utilized in all modes of operation. Other terms for auxiliary data channel are "DQX" and "optional data channel".

"Error correction channel" refers to a bus channel, which may comprise a single or multiple signal conductors, that is used to communicate error correction and/or error detection values for communicated data values. In one specific embodiment, the error correction channel is a single conductor (serial bit line) and is the exclusive conductor on the bus for communicating error correction values for data values communicated at least in part over other conductors of the bus. Another term for the error correction channel is the "EDC" channel.

"Logic" refers to machine memory circuits and non-transitory machine readable media comprising machine-executable instructions (software and firmware), and/or circuitry (hardware) which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

FIG. 1 depicts a machine memory system 100 in one embodiment. The machine memory system 100, which may for example be a GDDR SGRAM, provides data scrambling to improve system reliability.

Data for WRITE operations undergoes a CRC check by the CRC checker 102, and is decoded by a DQ/DQX MTA decoder 104 before being written to the DRAM 106. The CRC checker 102 operates on the DQ/DQX channel data bits and also on the EDC channel bits output from the EDC MTA decoder 108. On READ operations from the DRAM 106, a CRC is generated for the data bits by the CRC generator 110, the data bits are encoded onto the DQ/DQX lines by the DQ/DQX MTA encoder 112, and the CRC is encoded onto the EDC channel by the EDC MTA encoder 114.

Figure 2:
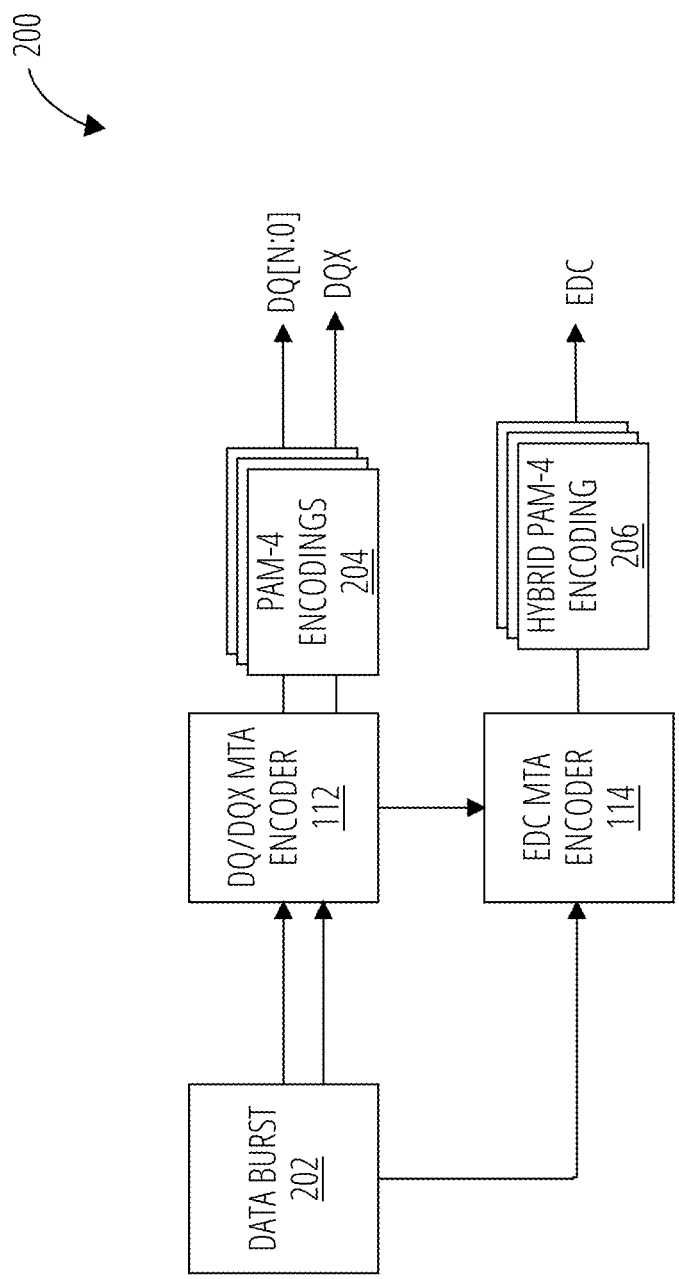
FIG. 2 depicts a burst read system 200 in accordance with one embodiment.

FIG. 2 depicts a burst read system 200 in one embodiment. A data burst 202 from a memory device is input to both of a DQ/DQX MTA encoder 112 and an EDC MTA encoder 114 (e.g., in parallel) and transformed into PAM-4 encodings 204 and Hybrid PAM-4 encoding 206 which together represent a transmission of both the data burst 202 and a CRC for the data burst 202 on the DQ[N:0]/DQX channels and EDC channels, respectively.

Figure 3:
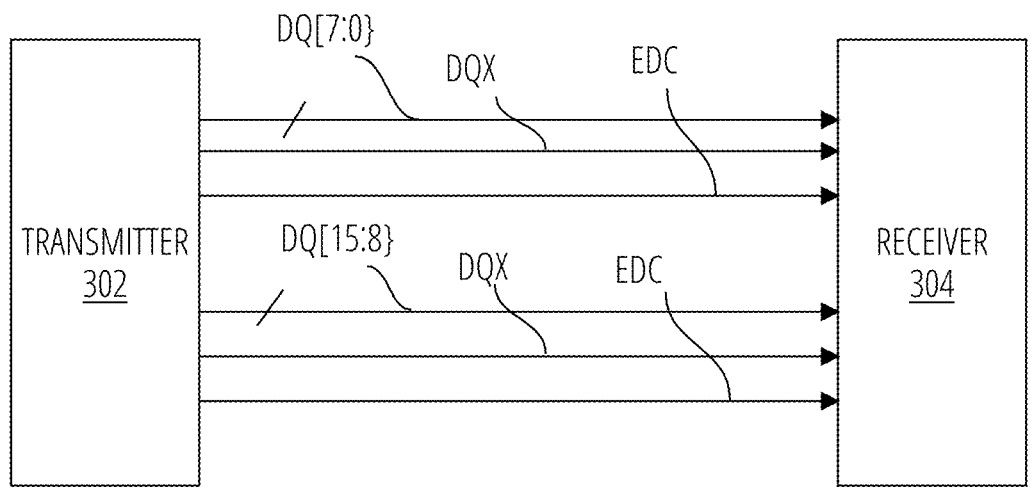
FIG. 3 depicts a system in accordance with one embodiment.

FIG. 3 depicts a system comprising a transmitter 302, a receiver 304, and two sets of eight parallel data channels DQ[7:0] and DQ[15:8] coupling the transmitter 302 to the receiver 304. Each set of data channels has an associated an auxiliary data channel DQX and error correction channel EDC. In accordance with the embodiments disclosed herein, the system may include logic (e.g., in the transmitter or in a distinct controller that operates the transmitter) to communicate every $8^{th}$ bit of data from seven of the eight parallel data channels in a 32-bit data burst on the auxiliary data channel channel and to communicate every $8^{th}$ bit of data from an eighth parallel data channel on the error correction channel.

FIG. 4 depicts a 7-8 bit encoding 400 in one embodiment. For both the raw data 402 and the encoded data 404, each row DQ[i] represents a serial data channel. In the raw data 402-402, the columns are sequential 2-bit positions in 16-bit data bursts. For example, the third and fourth bits of each data burst are represented in the column labeled d[2:3]. Each data burst is represented on each serial DQ channel as two ½ bursts of 8-bits each. For example, on DQ[0], the 16-bit data burst is conceptually divided into a first ½ burst d0[0]d0[7:1] and a second ½ burst d0[8]d0[15:9]. Each ½ burst is further conceptually divided into a 1-bit: 7-bit pair. For example, on DQ[0] the first ½ burst d0[0]d0[7:1] is divided into the 1-bit value d0[0] and the 7-bit value d0[7:1]. The data is not actually transmitted in raw form on the data channels, but rather is encoded first. The depiction in FIG. 4 is merely to show an example of how the raw data is divided up for encoding.

Referring now to the encoded data 404, the rows are once again the serial data channels, but now the columns represent symbols. For example, s[0] represents the first 2-bit PAM-4 symbol on each serial data channel, s[1] represents the second 2-bit PAM-4 symbol on each serial data channel, and so on. The 7-8 bit encoding 400 encodes pairs of the 1-bit raw data values, each pair from different serial data lines, as PAM-4 symbols on the DQX serial data channel. The remaining 7-bits of each ½ data burst are encoded into four PAM-4 symbols (called herein a codeword) on the corresponding serial data channel. For example, d0[0] and d0[8] are encoded as a 2-bit PAM-4 symbol on the DQX channel, d1[0] and d1[8] are encoded as a 2-bit PAM-4 symbol on the DQX channel, and so on. In general, any pairing of the 1-bit values from the serial data channels (referred to herein as interleaving) may be utilized to form the PAM-4 symbols on the DQX channel. In general, any bit position from each ½ burst may be the 1-bit value that is encoded into a symbol on the DQX channel, not just bit 0 and/or bit 8 as depicted.

However, in particular embodiments, the 1-bit values are the least significant bits of the ½ burst values, or the most significant bits of the ½ burst values.

For any given ½ burst there are 139 PAM-4 codewords that do not have internal −3 to +3 transitions and that have a pattern of {+3,+1,−1} or {−3,−1,+1}. Because only 7-bits of each ½ burst are encoded, only 128 of the 139 possible codewords with these transitions are needed to implement the maximum transition avoidance techniques described herein.

In one embodiment the MTA encoder may assume that the final (4th) symbol of the previous codeword is +3, and the following codeword is inverted if the most significant bit (MSB) of the previous codeword is 1. To prevent symbols encoded on the EDC channel from having +3/−3 transitions a symbol encoding a single bit at either +1 or −1 is positioned between each 2-bit encoding (4-level) symbol on EDC, creating what is referred to herein as a hybrid PAM-4 encoding 206.

Figure 5:
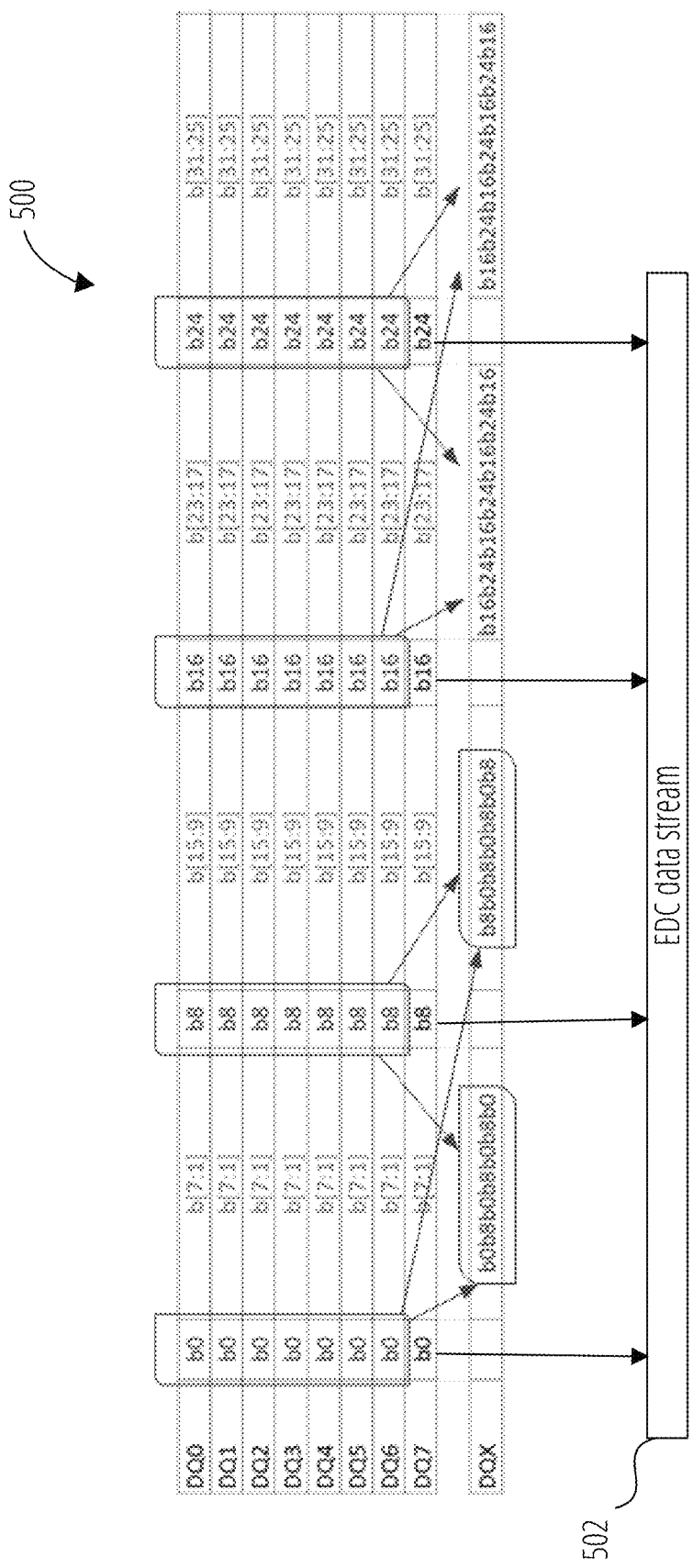
FIG. 5 depicts a 32-bit data burst 500 in another aspect.
Figure 6:
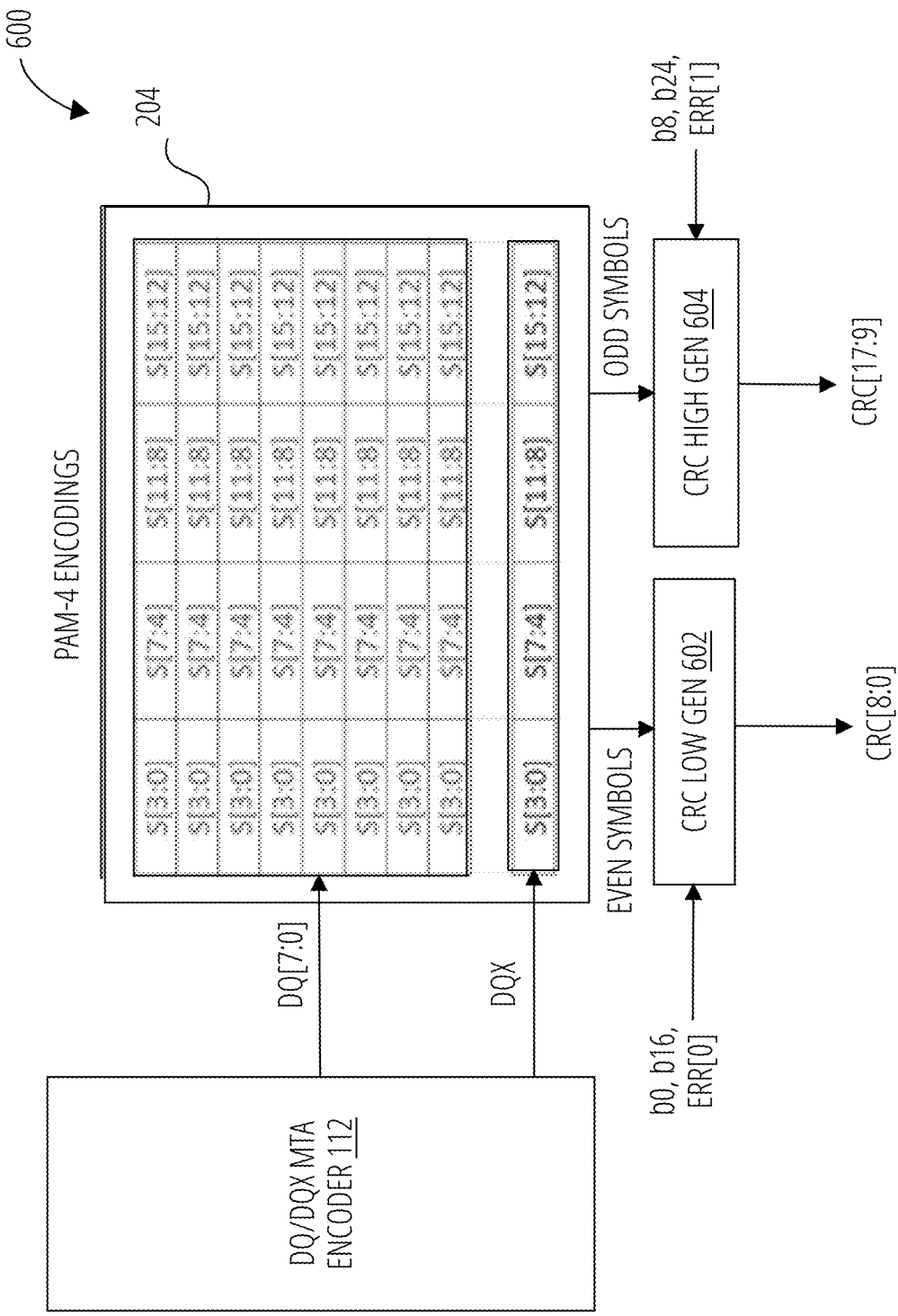
FIG. 6 depicts a DQ/DQX encoding 600 in accordance with one embodiment.
Figure 7:
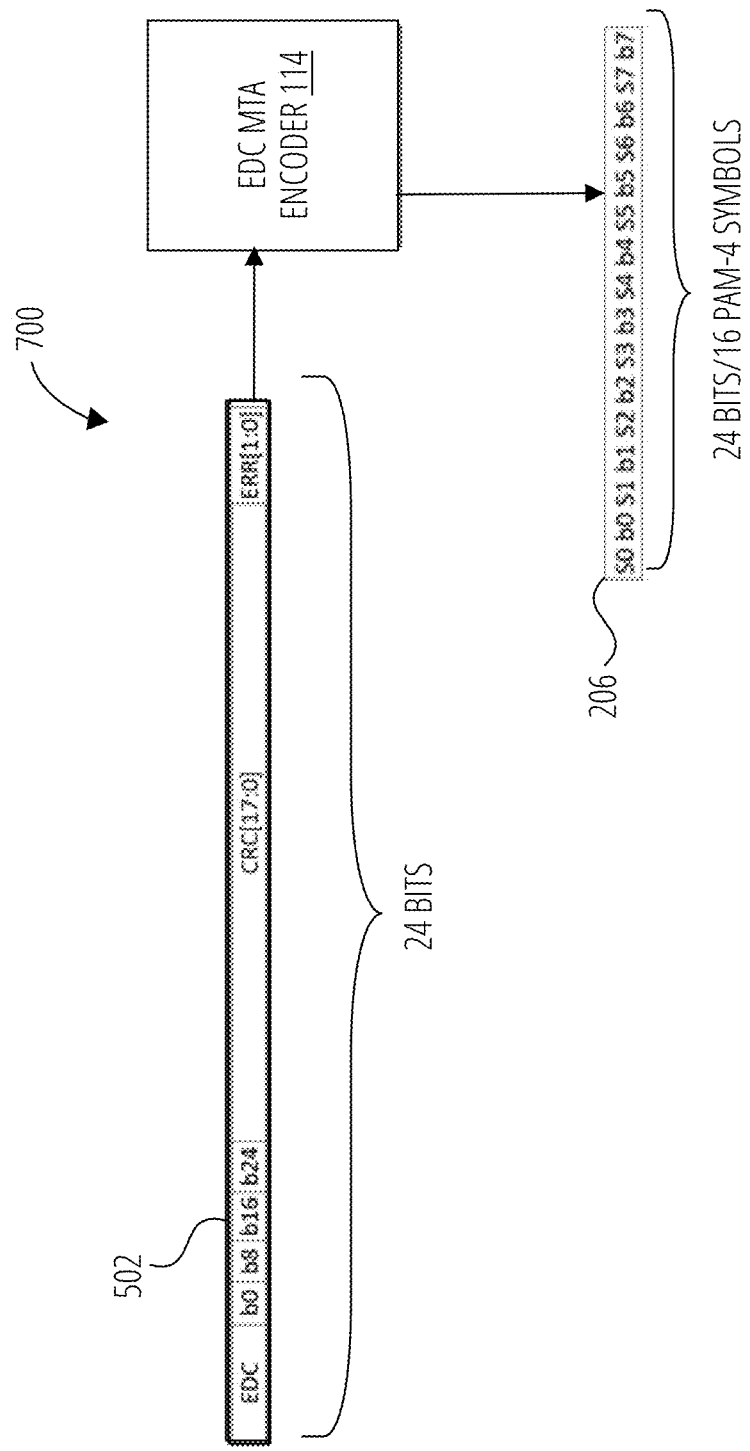
FIG. 7 depicts an EDC encoding 700 in accordance with one embodiment.

FIG. 5, FIG. 6, and FIG. 7 depict encoding of the 32-bit data burst and corresponding CRC onto the DQ/DQX and EDC channels.

As depicted for the DQ/DQX encoding 600 and EDC encoding 700, every $8^{th}$ bit of data on DQ0 through DQ6 in the 32-bit data burst 500 is directed to the DQX channel. Every $8^{th}$ bit on DQ7 is directed to the bi-directional EDC channel (where the CRC bits and ERR bits for the burst are also encoded as symbols) and encoded as a +1 or −1 PAM-4 symbols. This results in 28 bits of the 32-bit data burst 500 being directed to DQ0 through DQ6 and DQX. The twenty-eight bits of information are separated into four 7-bit streams (e.g., b[7:1], b[15:9], b[23:17], and b[31:25]) that are each MTA encoded by the DQ/DQX MTA encoder 112 to an 8-bit codeword that avoids PAM-4 maximum transitions (+3 to −3, −3 to +3) within the codeword and across codewords (see PAM-4 encodings 204). As described above in conjunction with FIG. 4, this technique may either invert the current codeword to transmit, or leave it unmodified, based on the last symbol in the previously transmitted codeword.

The EDC channel also utilizes an encoding scheme to avoid maximum transitions. The EDC data stream 502 comprises a combination of PAM-4 symbols encoding, alternately, 2-bits and 1-bit. Every even UI of the EDC data stream encodes 2-bits as a PAM-4 symbol (+3, +1, −1, −3), and every odd UI comprises a 1-bit symbol (+1, −1), thus transmitting 24-bits of information in a burst interval. This is referred to as hybrid PAM-4 encoding 206. This allows for the transmission on the EDC channel of 4-bits from DQ7, 18-bits of CRC code (9-bits of CRC generated for even symbols by a CRC low-bits generator 602 and another 9-bits of CRC generated for odd symbols by the CRC high-bits generator 604), and two 1-bit ERR flags to be transmitted within each burst interval. If READ MTA is disabled, the positions in the EDC data stream for the four bits from DQ7 may be set to '0', and none of the data will be MTA encoded prior to transmission.

As N (the encoding density) increases, there is more flexibility in the choices for the hybrid encoding. For example with PAM-8 encoding, every even UI of the EDC data stream may encode 4-bits as a PAM-8 symbol (+7, +5, +3, +1, −1, −3, −5, −7), and every odd UI as a 2-bit symbol (+3, +1, −1, −3) or a 1-bit symbol (+1, −1), depending on the implementation parameters.

Exemplary algorithms for MTA encoders and decoders for DQ/DQX and EDC channels are provided in the code listings.

The MTA example described above may be readily adapted for use with more than eight DQ channels, and/or with PAM-8 and higher encoding, and/or for use with channels other than or in addition to DQX and EDC.

Generally, first symbols are generated on a plurality of data channels by applying PAM-N encoding on a first subset of bits of a data burst, the first symbols generated without maximum transitions; second symbols are generated on at least one optionally-activated additional data channel, the second symbols generated by applying the PAM-N encoding on a second subset of bits of the data burst, the second symbols generated without maximum transitions; and third symbols are generated on a channel for communicating error correction bits for the first bits and second bits, the third symbols generated by applying hybrid PAM-N encoding on the error correction bits and a third subset of bits of the data burst, the hybrid PAM-N encoding comprising an interleaving of symbols with N voltage levels and symbols with less than N voltage levels.

The algorithms and techniques disclosed herein may be executed by computing devices utilizing one or more graphic processing unit (GPU) and/or general purpose data processor (e.g., a 'central processing unit or CPU). Exemplary architectures will now be described that may be configured to carry out the techniques disclosed herein on such devices. In particular MTA encoding techniques in accordance with the embodiments described herein may be utilized anywhere data or instructions are communicated between components of the exemplary systems described below.

The following description may use certain acronyms and abbreviations as follows:
"DPC" refers to a "data processing cluster";
"GPC" refers to a "general processing cluster";
"I/O" refers to a "input/output";
"L1 cache" refers to "level one cache";
"L2 cache" refers to "level two cache";
"LSU" refers to a "load/store unit";
"MMU" refers to a "memory management unit";
"MPC" refers to an "M-pipe controller";
"PPU" refers to a "parallel processing unit";
"PROP" refers to a "pre-raster operations unit";
"ROP" refers to a "raster operations";
"SFU" refers to a "special function unit";
"SM" refers to a "streaming multiprocessor";
"Viewport SCC" refers to "viewport scale, cull, and clip";
"WDX" refers to a "work distribution crossbar"; and
"XBar" refers to a "crossbar".

Parallel Processing Unit

Figure 8:
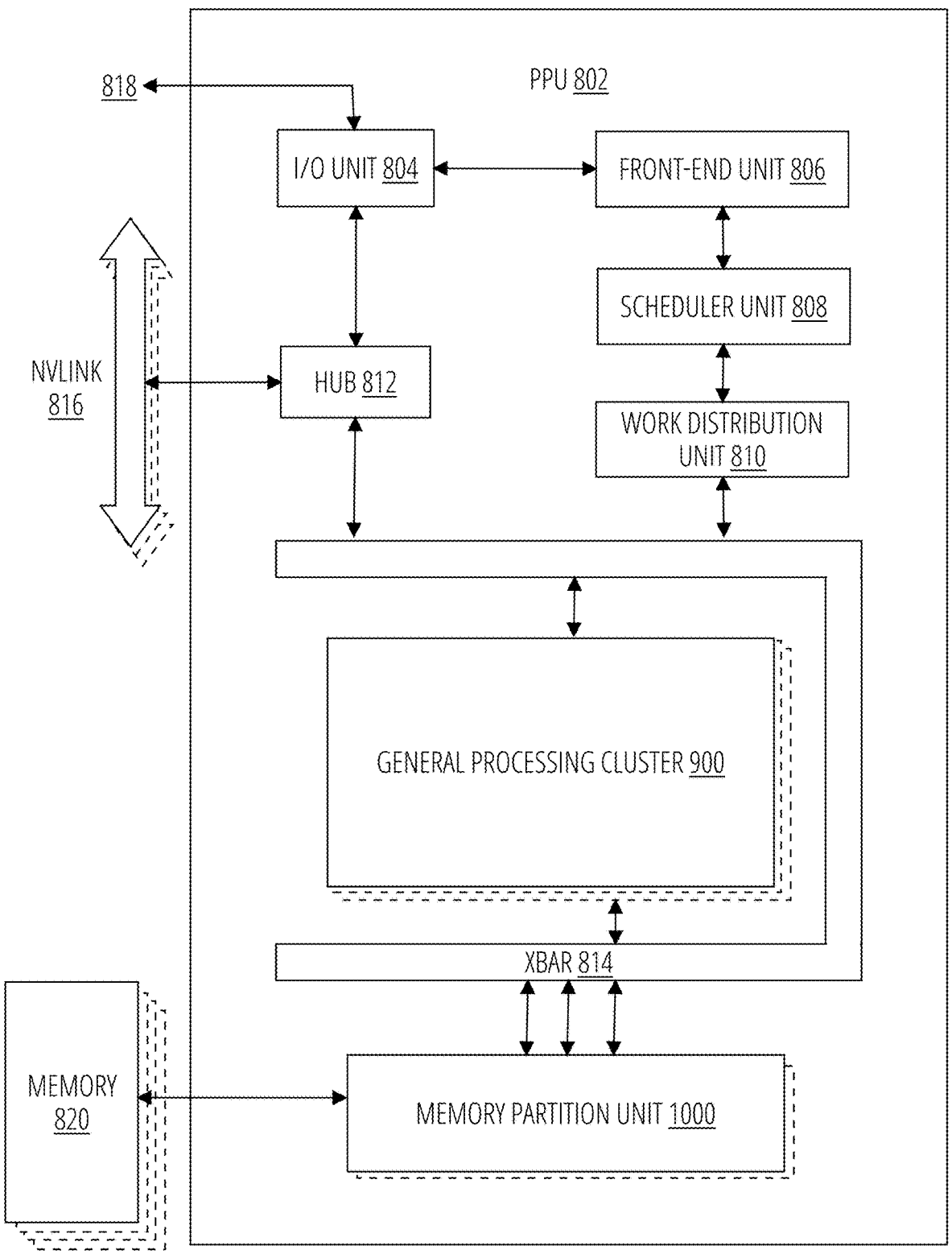
FIG. 8 depicts a parallel processing unit 802 in accordance with one embodiment.

FIG. 8 depicts a parallel processing unit 802 in accordance with an embodiment. In an embodiment, the parallel processing unit 802 is a multi-threaded processor that is implemented on one or more integrated circuit devices. The parallel processing unit 802 is a latency hiding architecture designed to process many threads in parallel. A thread (e.g., a thread of execution) is an instantiation of a set of instructions configured to be executed by the parallel processing unit 802. In an embodiment, the parallel processing unit 802 is a graphics processing unit (GPU) configured to implement a graphics rendering pipeline for processing three-dimensional (3D) graphics data in order to generate two-dimensional (2D) image data for display on a display device such as a liquid crystal display (LCD) device. In other embodiments, the parallel processing unit 802 may be utilized for performing general-purpose computations. While one exemplary parallel processor is provided herein for illustrative purposes, it should be strongly noted that such processor is set forth for illustrative purposes only, and that any processor may be employed to supplement and/or substitute for the same.

One or more parallel processing unit 802 modules may be configured to accelerate thousands of High Performance Computing (HPC), data center, and machine learning applications. The parallel processing unit 802 may be configured to accelerate numerous deep learning systems and applications including autonomous vehicle platforms, deep learning, high-accuracy speech, image, and text recognition systems, intelligent video analytics, molecular simulations, drug discovery, disease diagnosis, weather forecasting, big data analytics, astronomy, molecular dynamics simulation, financial modeling, robotics, factory automation, real-time language translation, online search optimizations, and personalized user recommendations, and the like.

As shown in FIG. 8, the parallel processing unit 802 includes an I/O unit 804, a front-end unit 806, a scheduler unit 808, a work distribution unit 810, a hub 812, a crossbar 814, one or more general processing cluster 900 modules, and one or more memory partition unit 1000 modules. The parallel processing unit 802 may be coupled to a host processor or other modules via one or more high-speed NVLink 816 interconnects. The parallel processing unit 802 may be coupled to a host processor or other peripheral devices via an interconnect 818. The parallel processing unit 802 may also be coupled to a local memory comprising a number of memory 820 devices. In an embodiment, the local memory may comprise a number of dynamic random access memory (DRAM) devices, such as GDDR SGRAM devices. The DRAM devices may be configured as a high-bandwidth memory (HBM) subsystem, with multiple DRAM dies stacked within each device. In one embodiment, the memory 820 and the parallel processing unit 802 may communicate using the MTA techniques disclosed herein.

The NVLink 816 interconnect (which may utilize embodiments of the techniques disclosed herein) enables systems to scale and include one or more parallel processing unit 802 modules combined with one or more CPUs, supports cache coherence between the parallel processing unit 802 modules and CPUs, and CPU mastering. Data and/or commands may be transmitted by the NVLink 816 through the hub 812 to/from other units of the parallel processing unit 802 such as one or more copy engines, a video encoder, a video decoder, a power management unit, etc. (not explicitly shown). The NVLink 816 is described in more detail in conjunction with FIG. 12.

The I/O unit 804 is configured to transmit and receive communications (e.g., commands, data, etc.) from a host processor (not shown) over the interconnect 818. The I/O unit 804 may communicate with the host processor directly via the interconnect 818 or through one or more intermediate devices such as a memory bridge. In an embodiment, the I/O unit 804 may communicate with one or more other processors, such as one or more parallel processing unit 802 modules via the interconnect 818. In an embodiment, the I/O unit 804 implements a Peripheral Component Interconnect Express (PCIe) interface for communications over a PCIe bus and the interconnect 818 is a PCIe bus. In alternative embodiments, the I/O unit 804 may implement other types of well-known interfaces for communicating with external devices.

The I/O unit 804 decodes packets received via the interconnect 818. In an embodiment, the packets represent commands configured to cause the parallel processing unit 802 to perform various operations. The I/O unit 804 transmits the decoded commands to various other units of the parallel processing unit 802 as the commands may specify. For example, some commands may be transmitted to the front-end unit 806. Other commands may be transmitted to the hub 812 or other units of the parallel processing unit 802 such as one or more copy engines, a video encoder, a video decoder, a power management unit, etc. (not explicitly shown). In other words, the I/O unit 804 is configured to route communications between and among the various logical units of the parallel processing unit 802.

In an embodiment, a program executed by the host processor encodes a command stream in a buffer that provides workloads to the parallel processing unit 802 for processing. A workload may comprise several instructions and data to be processed by those instructions. The buffer is a region in a memory that is accessible (e.g., read/write) by both the host processor and the parallel processing unit 802. For example, the I/O unit 804 may be configured to access the buffer in a system memory connected to the interconnect 818 via memory requests transmitted over the interconnect 818. In an embodiment, the host processor writes the command stream to the buffer and then transmits a pointer to the start of the command stream to the parallel processing unit 802. The front-end unit 806 receives pointers to one or more command streams. The front-end unit 806 manages the one or more streams, reading commands from the streams and forwarding commands to the various units of the parallel processing unit 802.

The front-end unit 806 is coupled to a scheduler unit 808 that configures the various general processing cluster 900 modules to process tasks defined by the one or more streams. The scheduler unit 808 is configured to track state information related to the various tasks managed by the scheduler unit 808. The state may indicate which general processing cluster 900 a task is assigned to, whether the task is active or inactive, a priority level associated with the task, and so forth. The scheduler unit 808 manages the execution of a plurality of tasks on the one or more general processing cluster 900 modules.

The scheduler unit 808 is coupled to a work distribution unit 810 that is configured to dispatch tasks for execution on the general processing cluster 900 modules. The work distribution unit 810 may track a number of scheduled tasks received from the scheduler unit 808. In an embodiment, the work distribution unit 810 manages a pending task pool and an active task pool for each of the general processing cluster 900 modules. The pending task pool may comprise a number of slots (e.g., 32 slots) that contain tasks assigned to be processed by a particular general processing cluster 900. The active task pool may comprise a number of slots (e.g., 4 slots) for tasks that are actively being processed by the general processing cluster 900 modules. As a general processing cluster 900 finishes the execution of a task, that task is evicted from the active task pool for the general processing cluster 900 and one of the other tasks from the pending task pool is selected and scheduled for execution on the general processing cluster 900. If an active task has been idle on the general processing cluster 900, such as while waiting for a data dependency to be resolved, then the active task may be evicted from the general processing cluster 900 and returned to the pending task pool while another task in the pending task pool is selected and scheduled for execution on the general processing cluster 900.

The work distribution unit 810 communicates with the one or more general processing cluster 900 modules via crossbar 814. The crossbar 814 is an interconnect network that couples many of the units of the parallel processing unit 802 to other units of the parallel processing unit 802. For example, the crossbar 814 may be configured to couple the work distribution unit 810 to a particular general processing cluster 900. Although not shown explicitly, one or more other units of the parallel processing unit 802 may also be connected to the crossbar 814 via the hub 812.

The tasks are managed by the scheduler unit 808 and dispatched to a general processing cluster 900 by the work distribution unit 810. The general processing cluster 900 is configured to process the task and generate results. The results may be consumed by other tasks within the general processing cluster 900, routed to a different general processing cluster 900 via the crossbar 814, or stored in the memory 820. The results can be written to the memory 820 via the memory partition unit 1000 modules, which implement a memory interface and logic (e.g., MTA logic in accordance with the disclosed techniques) for reading and writing data to/from the memory 820. The results can be transmitted to another parallel processing unit 802 or CPU via the NVLink 816. In an embodiment, the parallel processing unit 802 includes a number U of memory partition unit 1000 modules that is equal to the number of separate and distinct memory 820 devices coupled to the parallel processing unit 802. A memory partition unit 1000 will be described in more detail below in conjunction with FIG. 10.

In an embodiment, a host processor executes a driver kernel that implements an application programming interface (API) that enables one or more applications executing on the host processor to schedule operations for execution on the parallel processing unit 802. In an embodiment, multiple compute applications are simultaneously executed by the parallel processing unit 802 and the parallel processing unit 802 provides isolation, quality of service (QoS), and independent address spaces for the multiple compute applications. An application may generate instructions (e.g., API calls) that cause the driver kernel to generate one or more tasks for execution by the parallel processing unit 802. The driver kernel outputs tasks to one or more streams being processed by the parallel processing unit 802. Each task may comprise one or more groups of related threads, referred to herein as a warp. In an embodiment, a warp comprises 32 related threads that may be executed in parallel. Cooperating threads may refer to a plurality of threads including instructions to perform the task and that may exchange data through shared memory. Threads and cooperating threads are described in more detail in conjunction with FIG. 11.

Figure 9:
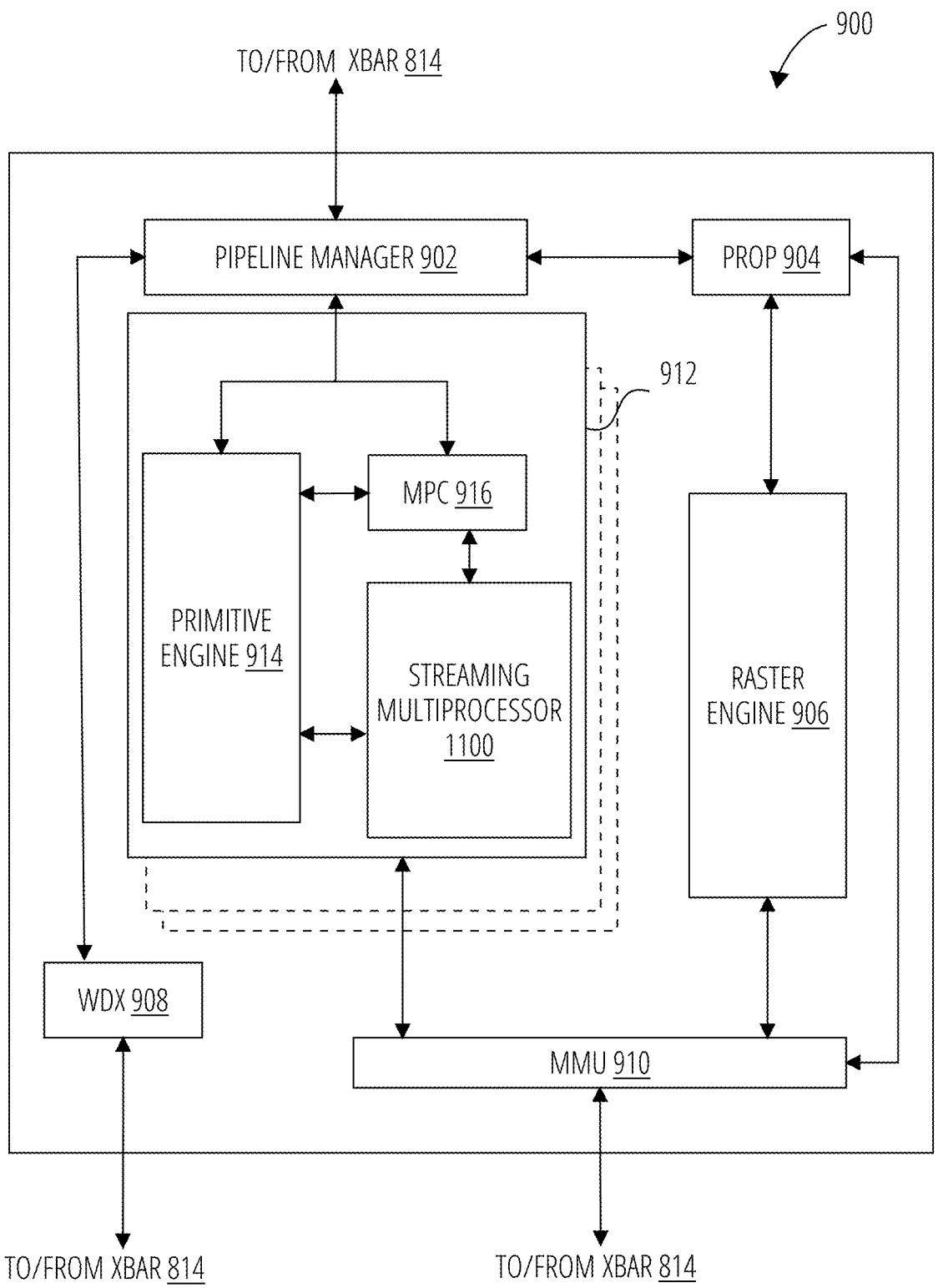
FIG. 9 depicts a general processing cluster 900 in accordance with one embodiment.

FIG. 9 depicts a general processing cluster 900 of the parallel processing unit 802 of FIG. 8, in accordance with an embodiment. As shown in FIG. 9, each general processing cluster 900 includes a number of hardware units for processing tasks. In an embodiment, each general processing cluster 900 includes a pipeline manager 902, a pre-raster operations unit 904, a raster engine 906, a work distribution crossbar 908, a memory management unit 910, and one or more data processing cluster 912. It will be appreciated that the general processing cluster 900 of FIG. 9 may include other hardware units in lieu of or in addition to the units shown in FIG. 9.

In an embodiment, the operation of the general processing cluster 900 is controlled by the pipeline manager 902. The pipeline manager 902 manages the configuration of the one or more data processing cluster 912 modules for processing tasks allocated to the general processing cluster 900. In an embodiment, the pipeline manager 902 may configure at least one of the one or more data processing cluster 912 modules to implement at least a portion of a graphics rendering pipeline. For example, a data processing cluster 912 may be configured to execute a vertex shader program on the programmable streaming multiprocessor 1100. The pipeline manager 902 may also be configured to route packets received from the work distribution unit 810 to the appropriate logical units within the general processing cluster 900. For example, some packets may be routed to fixed function hardware units in the pre-raster operations unit 904 and/or raster engine 906 while other packets may be routed to the data processing cluster 912 modules for processing by the primitive engine 914 or the streaming multiprocessor 1100. In an embodiment, the pipeline manager 902 may configure at least one of the one or more data processing cluster 912 modules to implement a neural network model and/or a computing pipeline.

Figure 10:
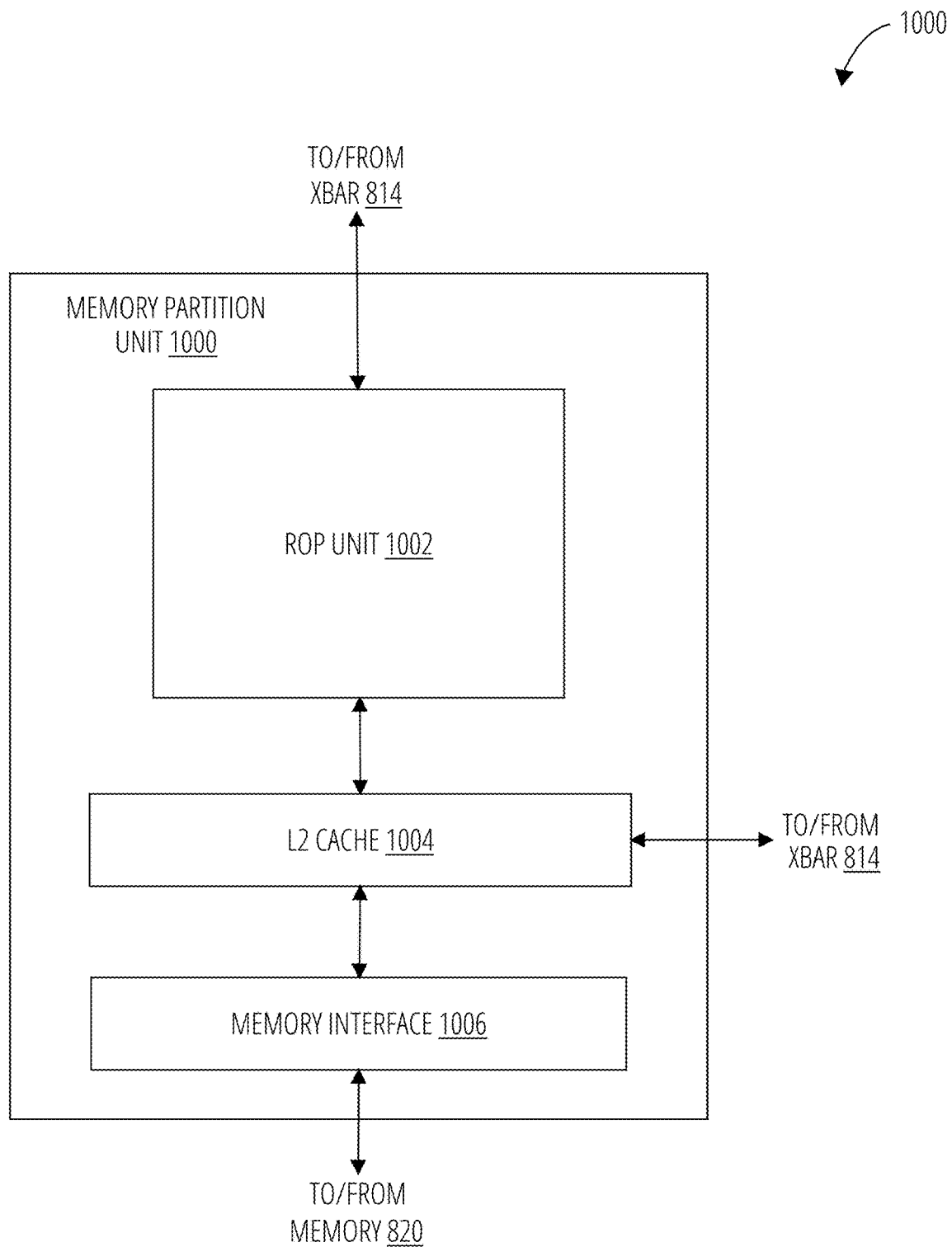
FIG. 10 depicts a memory partition unit 1000 in accordance with one embodiment.

The pre-raster operations unit 904 is configured to route data generated by the raster engine 906 and the data processing cluster 912 modules to a Raster Operations (ROP) unit, described in more detail in conjunction with FIG. 10. The pre-raster operations unit 904 may also be configured to perform optimizations for color blending, organize pixel data, perform address translations, and the like.

The raster engine 906 includes a number of fixed function hardware units configured to perform various raster operations. In an embodiment, the raster engine 906 includes a setup engine, a coarse raster engine, a culling engine, a clipping engine, a fine raster engine, and a tile coalescing engine. The setup engine receives transformed vertices and generates plane equations associated with the geometric primitive defined by the vertices. The plane equations are transmitted to the coarse raster engine to generate coverage information (e.g., an x, y coverage mask for a tile) for the primitive. The output of the coarse raster engine is transmitted to the culling engine where fragments associated with the primitive that fail a z-test are culled, and transmitted to a clipping engine where fragments lying outside a viewing frustum are clipped. Those fragments that survive clipping and culling may be passed to the fine raster engine to generate attributes for the pixel fragments based on the plane equations generated by the setup engine. The output of the raster engine 906 comprises fragments to be processed, for example, by a fragment shader implemented within a data processing cluster 912.

Each data processing cluster 912 included in the general processing cluster 900 includes an M-pipe controller 916, a primitive engine 914, and one or more streaming multiprocessor 1100 modules. The M-pipe controller 916 controls the operation of the data processing cluster 912, routing packets received from the pipeline manager 902 to the appropriate units in the data processing cluster 912. For example, packets associated with a vertex may be routed to the primitive engine 914, which is configured to fetch vertex attributes associated with the vertex from the memory 820. In contrast, packets associated with a shader program may be transmitted to the streaming multiprocessor 1100.

The streaming multiprocessor 1100 comprises a programmable streaming processor that is configured to process tasks represented by a number of threads. Each streaming multiprocessor 1100 is multi-threaded and configured to execute a plurality of threads (e.g., 32 threads) from a particular group of threads concurrently. In an embodiment, the streaming multiprocessor 1100 implements a Single-Instruction, Multiple-Data (SIMD) architecture where each thread in a group of threads (e.g., a warp) is configured to process a different set of data based on the same set of instructions. All threads in the group of threads execute the same instructions. In another embodiment, the streaming multiprocessor 1100 implements a Single-Instruction, Multiple Thread (SIMT) architecture where each thread in a group of threads is configured to process a different set of data based on the same set of instructions, but where individual threads in the group of threads are allowed to diverge during execution. In an embodiment, a program counter, call stack, and execution state is maintained for each warp, enabling concurrency between warps and serial execution within warps when threads within the warp diverge. In another embodiment, a program counter, call stack, and execution state is maintained for each individual thread, enabling equal concurrency between all threads, within and between warps. When execution state is maintained for each individual thread, threads executing the same instructions may be converged and executed in parallel for maximum efficiency. The streaming multiprocessor 1100 will be described in more detail below in conjunction with FIG. 11.

The memory management unit 910 provides an interface between the general processing cluster 900 and the memory partition unit 1000. The memory management unit 910 may provide translation of virtual addresses into physical addresses, memory protection, and arbitration of memory requests. In an embodiment, the memory management unit 910 provides one or more translation lookaside buffers (TLBs) for performing translation of virtual addresses into physical addresses in the memory 820.

FIG. 10 depicts a memory partition unit 1000 of the parallel processing unit 802 of FIG. 8, in accordance with an embodiment. As shown in FIG. 10, the memory partition unit 1000 includes a raster operations unit 1002, a level two cache 1004, and a memory interface 1006. The memory interface 1006 is coupled to the memory 820. Memory interface 1006 may implement 32, 64, 128, 1024-bit data buses, or the like, for high-speed data transfer. The memory interface 1006 may comprise logic to perform MTA in accordance with the disclosed embodiments. In an embodiment, the parallel processing unit 802 incorporates U memory interface 1006 modules, one memory interface 1006 per pair of memory partition unit 1000 modules, where each pair of memory partition unit 1000 modules is connected to a corresponding memory 820 device. For example, parallel processing unit 802 may be connected to up to Y memory 820 devices, such as high bandwidth memory stacks or graphics double-data-rate, version 5, synchronous dynamic random access memory, or other types of persistent storage.

In an embodiment, the memory interface 1006 implements an HBM2 memory interface and Y equals half U. In an embodiment, the HBM2 memory stacks are located on the same physical package as the parallel processing unit 802, providing substantial power and area savings compared with conventional GDDR SDRAM systems. In an embodiment, each HBM2 stack includes four memory dies and Y equals 4, with HBM2 stack including two 128-bit channels per die for a total of 8 channels and a data bus width of 1024 bits.

In an embodiment, the memory 820 supports Single-Error Correcting Double-Error Detecting (SECDED) Error Correction Code (ECC) to protect data. ECC provides higher reliability for compute applications that are sensitive to data corruption. Reliability is especially important in large-scale cluster computing environments where parallel processing unit 802 modules process very large datasets and/or run applications for extended periods.

In an embodiment, the parallel processing unit 802 implements a multi-level memory hierarchy. In an embodiment, the memory partition unit 1000 supports a unified memory to provide a single unified virtual address space for CPU and parallel processing unit 802 memory, enabling data sharing between virtual memory systems. In an embodiment the frequency of accesses by a parallel processing unit 802 to memory located on other processors is traced to ensure that memory pages are moved to the physical memory of the parallel processing unit 802 that is accessing the pages more frequently. In an embodiment, the NVLink 816 supports address translation services allowing the parallel processing unit 802 to directly access a CPU's page tables and providing full access to CPU memory by the parallel processing unit 802.

In an embodiment, copy engines transfer data between multiple parallel processing unit 802 modules or between parallel processing unit 802 modules and CPUs. The copy engines can generate page faults for addresses that are not mapped into the page tables. The memory partition unit 1000 can then service the page faults, mapping the addresses into the page table, after which the copy engine can perform the transfer. In a conventional system, memory is pinned (e.g., non-pageable) for multiple copy engine operations between multiple processors, substantially reducing the available memory. With hardware page faulting, addresses can be passed to the copy engines without worrying if the memory pages are resident, and the copy process is transparent.

Data from the memory 820 or other system memory may be fetched by the memory partition unit 1000 and stored in the level two cache 1004, which is located on-chip and is shared between the various general processing cluster 900 modules. As shown, each memory partition unit 1000 includes a portion of the level two cache 1004 associated with a corresponding memory 820 device. Lower level caches may then be implemented in various units within the general processing cluster 900 modules. For example, each of the streaming multiprocessor 1100 modules may implement an L1 cache. The L1 cache is private memory that is dedicated to a particular streaming multiprocessor 1100. Data from the level two cache 1004 may be fetched and stored in each of the L1 caches for processing in the functional units of the streaming multiprocessor 1100 modules. The level two cache 1004 is coupled to the memory interface 1006 and the crossbar 814.

The raster operations unit 1002 performs graphics raster operations related to pixel color, such as color compression, pixel blending, and the like. The raster operations unit 1002 also implements depth testing in conjunction with the raster engine 906, receiving a depth for a sample location associated with a pixel fragment from the culling engine of the raster engine 906. The depth is tested against a corresponding depth in a depth buffer for a sample location associated with the fragment. If the fragment passes the depth test for the sample location, then the raster operations unit 1002 updates the depth buffer and transmits a result of the depth test to the raster engine 906. It will be appreciated that the number of partition memory partition unit 1000 modules may be different than the number of general processing cluster 900 modules and, therefore, each raster operations unit 1002 may be coupled to each of the general processing cluster 900 modules. The raster operations unit 1002 tracks packets received from the different general processing cluster 900 modules and determines which general processing cluster 900 that a result generated by the raster operations unit 1002 is routed to through the crossbar 814. Although the raster operations unit 1002 is included within the memory partition unit 1000 in FIG. 10, in other embodiment, the raster operations unit 1002 may be outside of the memory partition unit 1000. For example, the raster operations unit 1002 may reside in the general processing cluster 900 or another unit.

Figure 11:
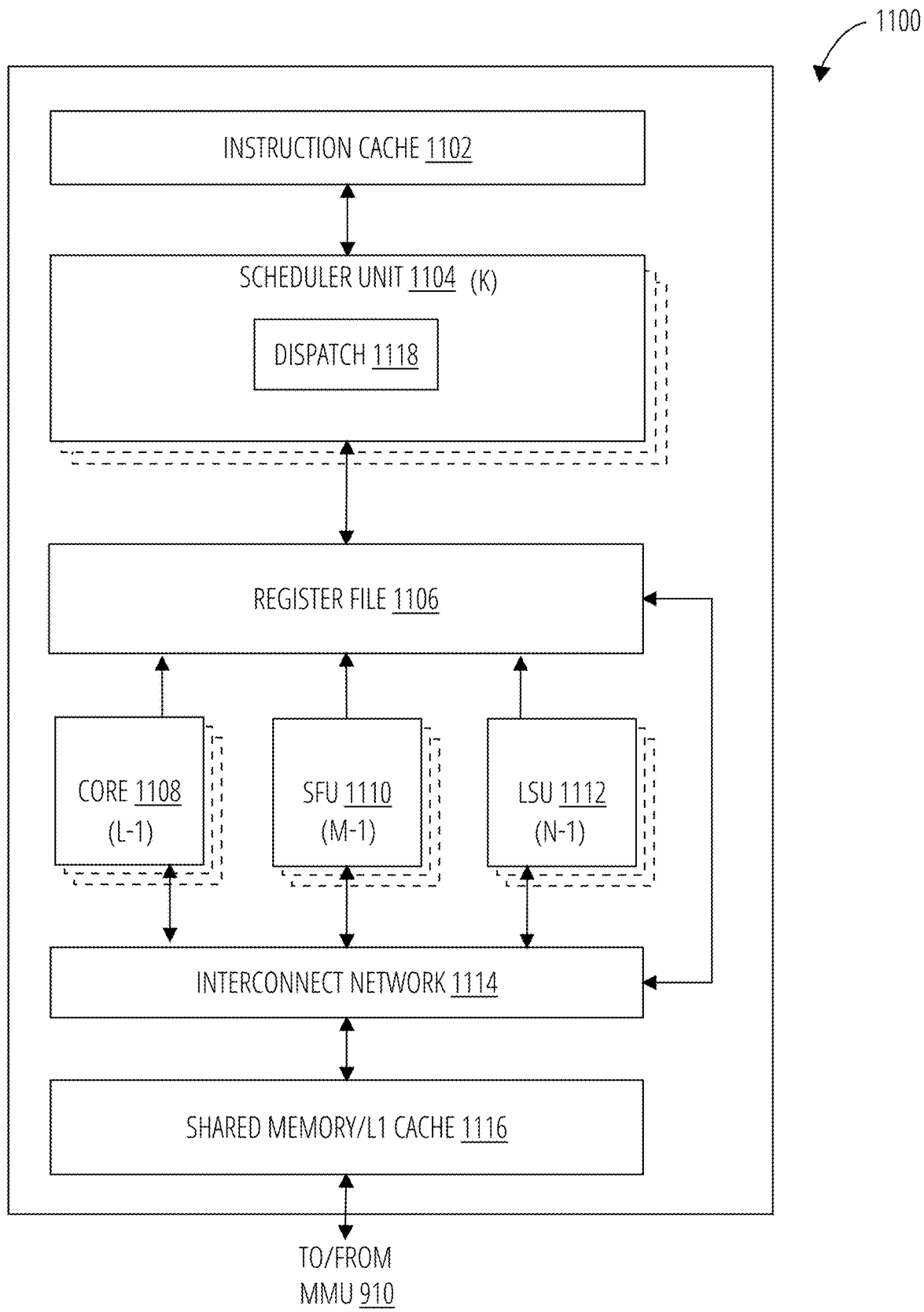
FIG. 11 depicts a streaming multiprocessor 1100 in accordance with one embodiment.

FIG. 11 illustrates the streaming multiprocessor 1100 of FIG. 9, in accordance with an embodiment. As shown in FIG. 11, the streaming multiprocessor 1100 includes an instruction cache 1102, one or more scheduler unit 1104 modules (e.g., such as scheduler unit 808), a register file 1106, one or more processing core 1108 modules, one or more special function unit 1110 modules, one or more load/store unit 1112 modules, an interconnect network 1114, and a shared memory/L1 cache 1116.

As described above, the work distribution unit 810 dispatches tasks for execution on the general processing cluster 900 modules of the parallel processing unit 802. The tasks are allocated to a particular data processing cluster 912 within a general processing cluster 900 and, if the task is associated with a shader program, the task may be allocated to a streaming multiprocessor 1100. The scheduler unit 808 receives the tasks from the work distribution unit 810 and manages instruction scheduling for one or more thread blocks assigned to the streaming multiprocessor 1100. The scheduler unit 1104 schedules thread blocks for execution as warps of parallel threads, where each thread block is allocated at least one warp. In an embodiment, each warp executes 32 threads. The scheduler unit 1104 may manage a plurality of different thread blocks, allocating the warps to the different thread blocks and then dispatching instructions from the plurality of different cooperative groups to the various functional units (e.g., core 1108 modules, special function unit 1110 modules, and load/store unit 1112 modules) during each clock cycle.

Cooperative Groups is a programming model for organizing groups of communicating threads that allows developers to express the granularity at which threads are communicating, enabling the expression of richer, more efficient parallel decompositions. Cooperative launch APIs support synchronization amongst thread blocks for the execution of parallel algorithms. Conventional programming models provide a single, simple construct for synchronizing cooperating threads: a barrier across all threads of a thread block (e.g., the syncthreads( ) function). However, programmers would often like to define groups of threads at smaller than thread block granularities and synchronize within the defined groups to enable greater performance, design flexibility, and software reuse in the form of collective group-wide function interfaces.

Cooperative Groups enables programmers to define groups of threads explicitly at sub-block (e.g., as small as a single thread) and multi-block granularities, and to perform collective operations such as synchronization on the threads in a cooperative group. The programming model supports clean composition across software boundaries, so that libraries and utility functions can synchronize safely within their local context without having to make assumptions about convergence. Cooperative Groups primitives enable new patterns of cooperative parallelism, including producer-consumer parallelism, opportunistic parallelism, and global synchronization across an entire grid of thread blocks.

A dispatch 1118 unit is configured within the scheduler unit 1104 to transmit instructions to one or more of the functional units. In one embodiment, the scheduler unit 1104 includes two dispatch 1118 units that enable two different instructions from the same warp to be dispatched during each clock cycle. In alternative embodiments, each scheduler unit 1104 may include a single dispatch 1118 unit or additional dispatch 1118 units.

Each streaming multiprocessor 1100 includes a register file 1106 that provides a set of registers for the functional units of the streaming multiprocessor 1100. In an embodiment, the register file 1106 is divided between each of the functional units such that each functional unit is allocated a dedicated portion of the register file 1106. In another embodiment, the register file 1106 is divided between the different warps being executed by the streaming multiprocessor 1100. The register file 1106 provides temporary storage for operands connected to the data paths of the functional units.

Each streaming multiprocessor 1100 comprises L processing core 1108 modules. In an embodiment, the streaming multiprocessor 1100 includes a large number (e.g., 128, etc.) of distinct processing core 1108 modules. Each core 1108 may include a fully-pipelined, single-precision, double-precision, and/or mixed precision processing unit that includes a floating point arithmetic logic unit and an integer arithmetic logic unit. In an embodiment, the floating point arithmetic logic units implement the IEEE 754-2008 standard for floating point arithmetic. In an embodiment, the core 1108 modules include 64 single-precision (32-bit) floating point cores, 64 integer cores, 32 double-precision (64-bit) floating point cores, and 8 tensor cores.

Tensor cores configured to perform matrix operations, and, in an embodiment, one or more tensor cores are included in the core 1108 modules. In particular, the tensor cores are configured to perform deep learning matrix arithmetic, such as convolution operations for neural network training and inferencing. In an embodiment, each tensor core operates on a 4×4 matrix and performs a matrix multiply and accumulate operation D=A'B+C, where A, B, C, and D are 4×4 matrices.

In an embodiment, the matrix multiply inputs A and B are 16-bit floating point matrices, while the accumulation matrices C and D may be 16-bit floating point or 32-bit floating point matrices. Tensor Cores operate on 16-bit floating point input data with 32-bit floating point accumulation. The 16-bit floating point multiply requires 64 operations and results in a full precision product that is then accumulated using 32-bit floating point addition with the other intermediate products for a 4×4×4 matrix multiply. In practice, Tensor Cores are used to perform much larger two-dimensional or higher dimensional matrix operations, built up from these smaller elements. An API, such as CUDA 9 C++ API, exposes specialized matrix load, matrix multiply and accumulate, and matrix store operations to efficiently use Tensor Cores from a CUDA-C++ program. At the CUDA level, the warp-level interface assumes 16×16 size matrices spanning all 32 threads of the warp.

Each streaming multiprocessor 1100 also comprises M special function unit 1110 modules that perform special functions (e.g., attribute evaluation, reciprocal square root, and the like). In an embodiment, the special function unit 1110 modules may include a tree traversal unit configured to traverse a hierarchical tree data structure. In an embodiment, the special function unit 1110 modules may include texture unit configured to perform texture map filtering operations. In an embodiment, the texture units are configured to load texture maps (e.g., a 2D array of texels) from the memory 820 and sample the texture maps to produce sampled texture values for use in shader programs executed by the streaming multiprocessor 1100. In an embodiment, the texture maps are stored in the shared memory/L1 cache 1116. The texture units implement texture operations such as filtering operations using mip-maps (e.g., texture maps of varying levels of detail). In an embodiment, each streaming multiprocessor 1100 includes two texture units.

Each streaming multiprocessor 1100 also comprises N load/store unit 1112 modules that implement load and store operations between the shared memory/L1 cache 1116 and the register file 1106. Each streaming multiprocessor 1100 includes an interconnect network 1114 that connects each of the functional units to the register file 1106 and the load/store unit 1112 to the register file 1106 and shared memory/L1 cache 1116. In an embodiment, the interconnect network 1114 is a crossbar that can be configured to connect any of the functional units to any of the registers in the register file 1106 and connect the load/store unit 1112 modules to the register file 1106 and memory locations in shared memory/L1 cache 1116.

The shared memory/L1 cache 1116 is an array of on-chip memory that allows for data storage and communication between the streaming multiprocessor 1100 and the primitive engine 914 and between threads in the streaming multiprocessor 1100. In an embodiment, the shared memory/L1 cache 1116 comprises 128 KB of storage capacity and is in the path from the streaming multiprocessor 1100 to the memory partition unit 1000. The shared memory/L1 cache 1116 can be used to cache reads and writes. One or more of the shared memory/L1 cache 1116, level two cache 1004, and memory 820 are backing stores.

Combining data cache and shared memory functionality into a single memory block provides the best overall performance for both types of memory accesses. The capacity is usable as a cache by programs that do not use shared memory. For example, if shared memory is configured to use half of the capacity, texture and load/store operations can use the remaining capacity. Integration within the shared memory/L1 cache 1116 enables the shared memory/L1 cache 1116 to function as a high-throughput conduit for streaming data while simultaneously providing high-bandwidth and low-latency access to frequently reused data.

When configured for general purpose parallel computation, a simpler configuration can be used compared with graphics processing. Specifically, the fixed function graphics processing units shown in FIG. 8, are bypassed, creating a much simpler programming model. In the general purpose parallel computation configuration, the work distribution unit 810 assigns and distributes blocks of threads directly to the data processing cluster 912 modules. The threads in a block execute the same program, using a unique thread ID in the calculation to ensure each thread generates unique results, using the streaming multiprocessor 1100 to execute the program and perform calculations, shared memory/L1 cache 1116 to communicate between threads, and the load/store unit 1112 to read and write global memory through the shared memory/L1 cache 1116 and the memory partition unit 1000. When configured for general purpose parallel computation, the streaming multiprocessor 1100 can also write commands that the scheduler unit 808 can use to launch new work on the data processing cluster 912 modules.

The parallel processing unit 802 may be included in a desktop computer, a laptop computer, a tablet computer, servers, supercomputers, a smart-phone (e.g., a wireless, hand-held device), personal digital assistant (PDA), a digital camera, a vehicle, a head mounted display, a hand-held electronic device, and the like. In an embodiment, the parallel processing unit 802 is embodied on a single semiconductor substrate. In another embodiment, the parallel processing unit 802 is included in a system-on-a-chip (SoC) along with one or more other devices such as additional parallel processing unit 802 modules, the memory 820, a reduced instruction set computer (RISC) CPU, a memory management unit (MMU), a digital-to-analog converter (DAC), and the like.

In an embodiment, the parallel processing unit 802 may be included on a graphics card that includes one or more memory devices. The graphics card may be configured to interface with a PCIe slot on a motherboard of a desktop computer. In yet another embodiment, the parallel processing unit 802 may be an integrated graphics processing unit (iGPU) or parallel processor included in the chipset of the motherboard.

Exemplary Computing System

Systems with multiple GPUs and CPUs are used in a variety of industries as developers expose and leverage more parallelism in applications such as artificial intelligence computing. High-performance GPU-accelerated systems with tens to many thousands of compute nodes are deployed in data centers, research facilities, and supercomputers to solve ever larger problems. As the number of processing devices within the high-performance systems increases, the communication and data transfer mechanisms need to scale to support the increased bandwidth.

Figure 12:
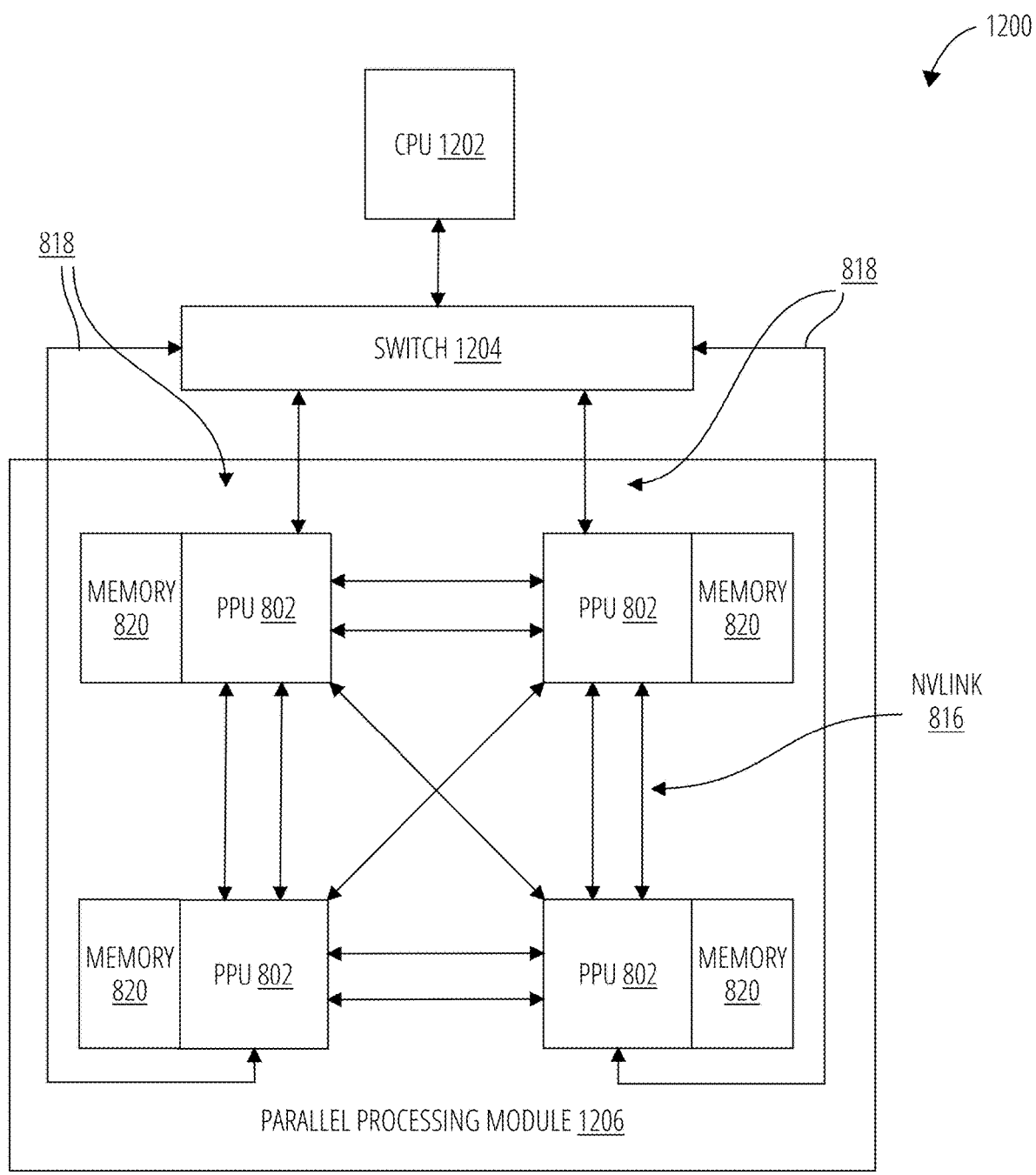
FIG. 12 depicts a processing system 1200 in accordance with one embodiment.

FIG. 12 is a conceptual diagram of a processing system 1200 implemented using the parallel processing unit 802 of FIG. 8, in accordance with an embodiment. The processing system 1200 includes a central processing unit 1202, switch 1204, and multiple parallel processing unit 802 modules each and respective memory 820 modules. The NVLink 816 provides high-speed communication links between each of the parallel processing unit 802 modules. Although a particular number of NVLink 816 and interconnect 818 connections are illustrated in FIG. 12, the number of connections to each parallel processing unit 802 and the central processing unit 1202 may vary. The switch 1204 interfaces between the interconnect 818 and the central processing unit 1202. The parallel processing unit 802 modules, memory 820 modules, and NVLink 816 connections may be situated on a single semiconductor platform to form a parallel processing module 1206. In an embodiment, the switch 1204 supports two or more protocols to interface between various different connections and/or links.

In another embodiment (not shown), the NVLink 816 provides one or more high-speed communication links between each of the parallel processing unit modules (parallel processing unit 802, parallel processing unit 802, parallel processing unit 802, and parallel processing unit 802) and the central processing unit 1202 and the switch 1204 interfaces between the interconnect 818 and each of the parallel processing unit modules. The parallel processing unit modules, memory 820 modules, and interconnect 818 may be situated on a single semiconductor platform to form a parallel processing module 1206. In yet another embodiment (not shown), the interconnect 818 provides one or more communication links between each of the parallel processing unit modules and the central processing unit 1202 and the switch 1204 interfaces between each of the parallel processing unit modules using the NVLink 816 to provide one or more high-speed communication links between the parallel processing unit modules. In another embodiment (not shown), the NVLink 816 provides one or more high-speed communication links between the parallel processing unit modules and the central processing unit 1202 through the switch 1204. In yet another embodiment (not shown), the interconnect 818 provides one or more communication links between each of the parallel processing unit modules directly. One or more of the NVLink 816 high-speed communication links may be implemented as a physical NVLink interconnect or either an on-chip or on-die interconnect using the same protocol as the NVLink 816.

In the context of the present description, a single semiconductor platform may refer to a sole unitary semiconductor-based integrated circuit fabricated on a die or chip. It should be noted that the term single semiconductor platform may also refer to multi-chip modules with increased connectivity which simulate on-chip operation and make substantial improvements over utilizing a conventional bus implementation. Of course, the various circuits or devices may also be situated separately or in various combinations of semiconductor platforms per the desires of the user. Alternately, the parallel processing module 1206 may be implemented as a circuit board substrate and each of the parallel processing unit modules and/or memory 820 modules may be packaged devices. In an embodiment, the central processing unit 1202, switch 1204, and the parallel processing module 1206 are situated on a single semiconductor platform.

In an embodiment, the signaling rate of each NVLink 816 is 20 to 25 Gigabits/second and each parallel processing unit module includes six NVLink 816 interfaces (as shown in FIG. 12, five NVLink 816 interfaces are included for each parallel processing unit module). Each NVLink 816 provides a data transfer rate of 25 Gigabytes/second in each direction, with six links providing 300 Gigabytes/second. The NVLink 816 can be used exclusively for PPU-to-PPU communication as shown in FIG. 12, or some combination of PPU-to-PPU and PPU-to-CPU, when the central processing unit 1202 also includes one or more NVLink 816 interfaces.

In an embodiment, the NVLink 816 allows direct load/store/atomic access from the central processing unit 1202 to each parallel processing unit module's memory 820. In an embodiment, the NVLink 816 supports coherency operations, allowing data read from the memory 820 modules to be stored in the cache hierarchy of the central processing unit 1202, reducing cache access latency for the central processing unit 1202. In an embodiment, the NVLink 816 includes support for Address Translation Services (ATS), enabling the parallel processing unit module to directly access page tables within the central processing unit 1202. One or more of the NVLink 816 may also be configured to operate in a low-power mode.

Figure 13:
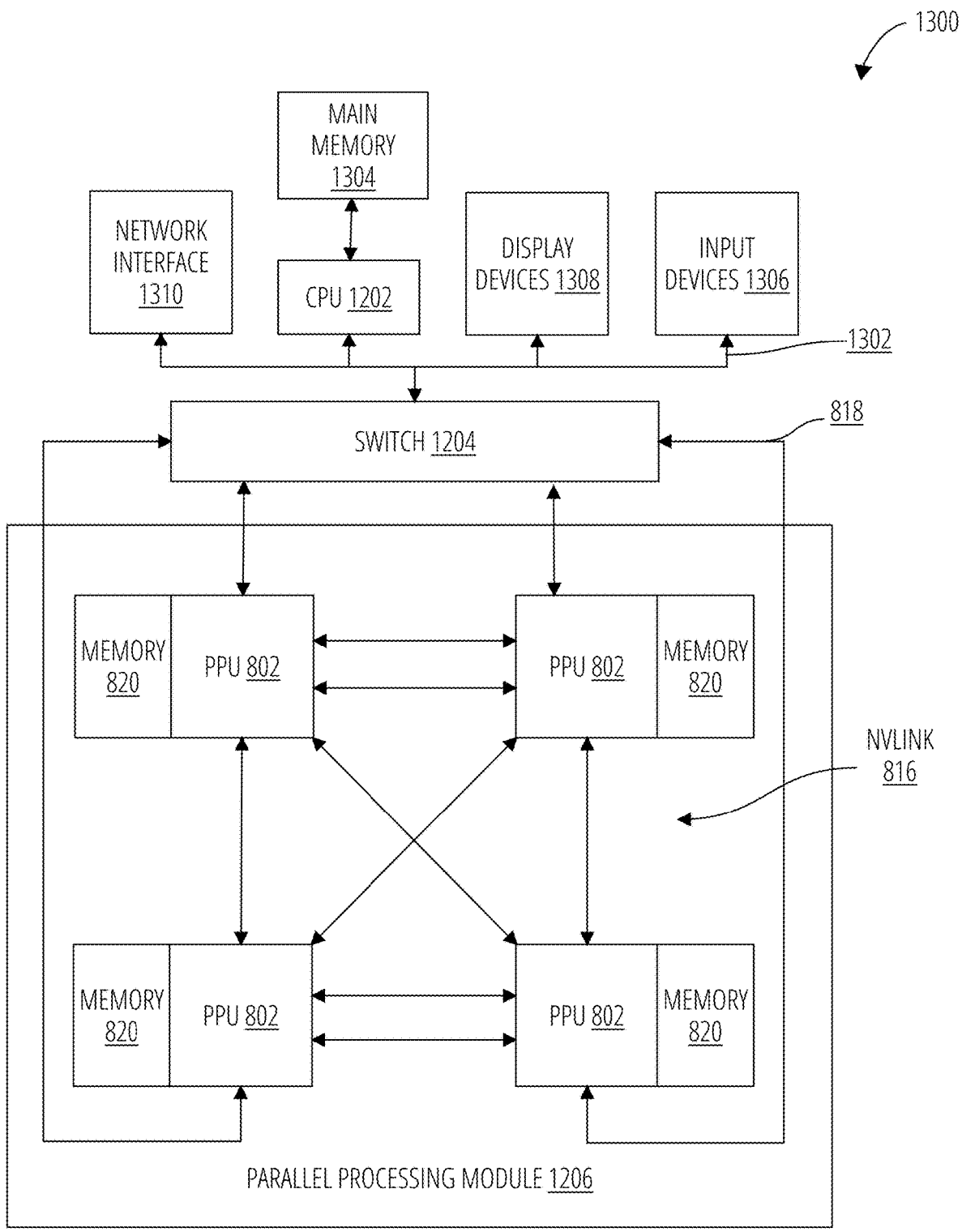
FIG. 13 depicts an exemplary processing system 1300 in accordance with another embodiment.

FIG. 13 depicts an exemplary processing system 1300 in which the various architecture and/or functionality of the various previous embodiments may be implemented. As shown, an exemplary processing system 1300 is provided including at least one central processing unit 1202 that is connected to a communications bus 1302. The communication communications bus 1302 may be implemented using any suitable protocol, such as PCI (Peripheral Component Interconnect), PCI-Express, AGP (Accelerated Graphics Port), HyperTransport, or any other bus or point-to-point communication protocol(s). The exemplary processing system 1300 also includes a main memory 1304. Control logic (software) and data are stored in the main memory 1304 which may take the form of random access memory (RAM).

The exemplary processing system 1300 also includes input devices 1306, the parallel processing module 1206, and display devices 1308, e.g. a conventional CRT (cathode ray tube), LCD (liquid crystal display), LED (light emitting diode), plasma display or the like. User input may be received from the input devices 1306, e.g., keyboard, mouse, touchpad, microphone, and the like. Each of the foregoing modules and/or devices may even be situated on a single semiconductor platform to form the exemplary processing system 1300. Alternately, the various modules may also be situated separately or in various combinations of semiconductor platforms per the desires of the user.

Further, the exemplary processing system 1300 may be coupled to a network (e.g., a telecommunications network, local area network (LAN), wireless network, wide area network (WAN) such as the Internet, peer-to-peer network, cable network, or the like) through a network interface 1310 for communication purposes.

The exemplary processing system 1300 may also include a secondary storage (not shown). The secondary storage includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, may be stored in the main memory 1304 and/or the secondary storage. Such computer programs, when executed, enable the exemplary processing system 1300 to perform various functions. The main memory 1304, the storage, and/or any other storage are possible examples of computer-readable media.

The architecture and/or functionality of the various previous figures may be implemented in the context of a general computer system, a circuit board system, a game console system dedicated for entertainment purposes, an application-specific system, and/or any other desired system. For example, the exemplary processing system 1300 may take the form of a desktop computer, a laptop computer, a tablet computer, servers, supercomputers, a smart-phone (e.g., a wireless, hand-held device), personal digital assistant (PDA), a digital camera, a vehicle, a head mounted display, a hand-held electronic device, a mobile phone device, a television, workstation, game consoles, embedded system, and/or any other type of logic.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

Graphics Processing Pipeline

Figure 14:
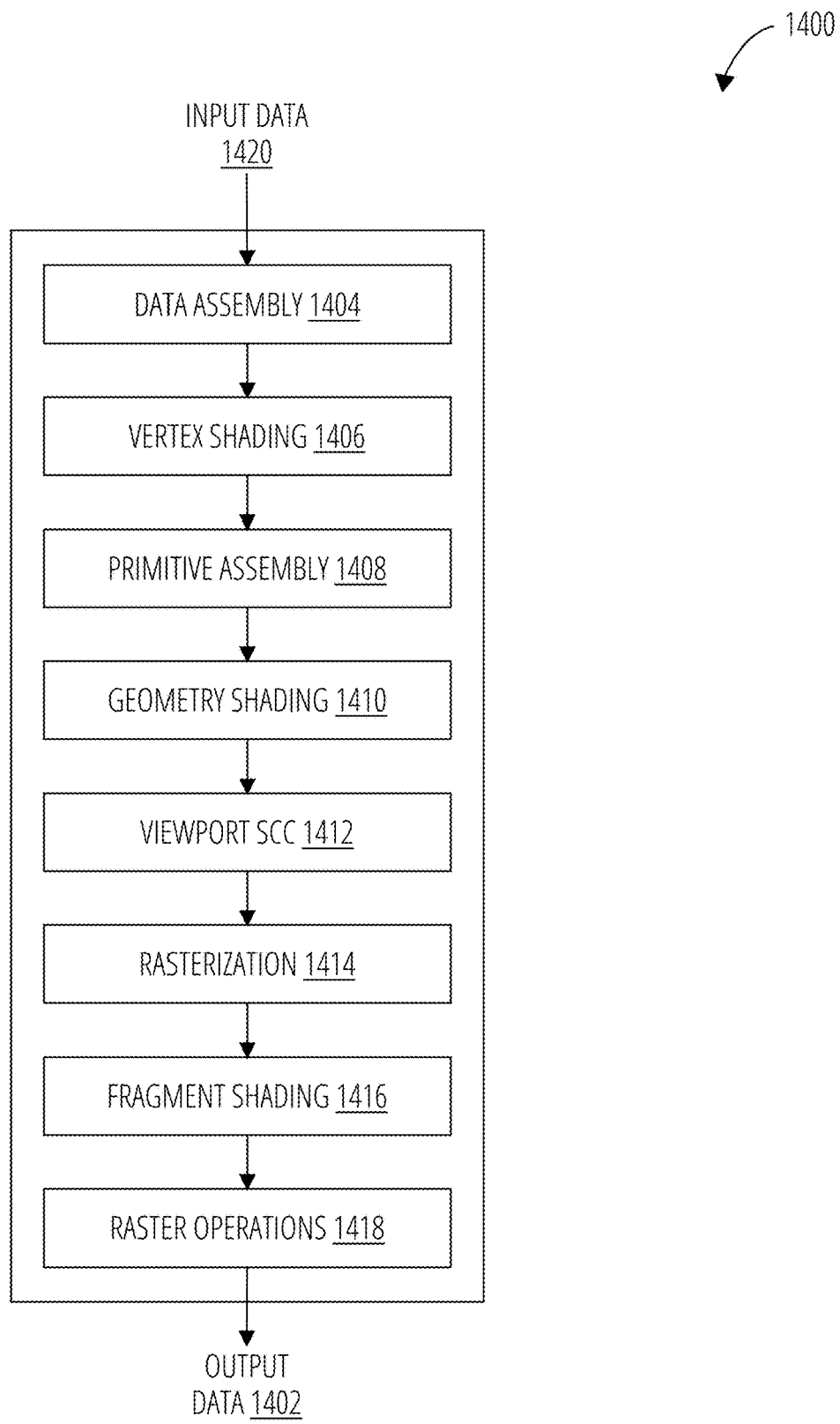
FIG. 14 depicts a graphics processing pipeline 1400 in accordance with one embodiment.

FIG. 14 is a conceptual diagram of a graphics processing pipeline 1400 implemented by the parallel processing unit 802 of FIG. 8, in accordance with an embodiment. In an embodiment, the parallel processing unit 802 comprises a graphics processing unit (GPU). The parallel processing unit 802 is configured to receive commands that specify shader programs for processing graphics data. Graphics data may be defined as a set of primitives such as points, lines, triangles, quads, triangle strips, and the like. Typically, a primitive includes data that specifies a number of vertices for the primitive (e.g., in a model-space coordinate system) as well as attributes associated with each vertex of the primitive. The parallel processing unit 802 can be configured to process the graphics primitives to generate a frame buffer (e.g., pixel data for each of the pixels of the display).

An application writes model data for a scene (e.g., a collection of vertices and attributes) to a memory such as a system memory or memory 820. The model data defines each of the objects that may be visible on a display. The application then makes an API call to the driver kernel that requests the model data to be rendered and displayed. The driver kernel reads the model data and writes commands to the one or more streams to perform operations to process the model data. The commands may reference different shader programs to be implemented on the streaming multiprocessor 1100 modules of the parallel processing unit 802 including one or more of a vertex shader, hull shader, domain shader, geometry shader, and a pixel shader. For example, one or more of the streaming multiprocessor 1100 modules may be configured to execute a vertex shader program that processes a number of vertices defined by the model data. In an embodiment, the different streaming multiprocessor 1100 modules may be configured to execute different shader programs concurrently. For example, a first subset of streaming multiprocessor 1100 modules may be configured to execute a vertex shader program while a second subset of streaming multiprocessor 1100 modules may be configured to execute a pixel shader program. The first subset of streaming multiprocessor 1100 modules processes vertex data to produce processed vertex data and writes the processed vertex data to the level two cache 1004 and/or the memory 820. After the processed vertex data is rasterized (e.g., transformed from three-dimensional data into two-dimensional data in screen space) to produce fragment data, the second subset of streaming multiprocessor 1100 modules executes a pixel shader to produce processed fragment data, which is then blended with other processed fragment data and written to the frame buffer in memory 820. The vertex shader program and pixel shader program may execute concurrently, processing different data from the same scene in a pipelined fashion until all of the model data for the scene has been rendered to the frame buffer. Then, the contents of the frame buffer are transmitted to a display controller for display on a display device.

The graphics processing pipeline 1400 is an abstract flow diagram of the processing steps implemented to generate 2D computer-generated images from 3D geometry data. As is well-known, pipeline architectures may perform long latency operations more efficiently by splitting up the operation into a plurality of stages, where the output of each stage is coupled to the input of the next successive stage. Thus, the graphics processing pipeline 1400 receives input data 601 that is transmitted from one stage to the next stage of the graphics processing pipeline 1400 to generate output data 1402. In an embodiment, the graphics processing pipeline 1400 may represent a graphics processing pipeline defined by the OpenGL® API. As an option, the graphics processing pipeline 1400 may be implemented in the context of the functionality and architecture of the previous Figures and/or any subsequent Figure(s).

As shown in FIG. 14, the graphics processing pipeline 1400 comprises a pipeline architecture that includes a number of stages. The stages include, but are not limited to, a data assembly 1404 stage, a vertex shading 1406 stage, a primitive assembly 1408 stage, a geometry shading 1410 stage, a viewport SCC 1412 stage, a rasterization 1414 stage, a fragment shading 1416 stage, and a raster operations 1418 stage. In an embodiment, the input data 1420 comprises commands that configure the processing units to implement the stages of the graphics processing pipeline 1400 and geometric primitives (e.g., points, lines, triangles, quads, triangle strips or fans, etc.) to be processed by the stages. The output data 1402 may comprise pixel data (e.g., color data) that is copied into a frame buffer or other type of surface data structure in a memory.

The data assembly 1404 stage receives the input data 1420 that specifies vertex data for high-order surfaces, primitives, or the like. The data assembly 1404 stage collects the vertex data in a temporary storage or queue, such as by receiving a command from the host processor that includes a pointer to a buffer in memory and reading the vertex data from the buffer. The vertex data is then transmitted to the vertex shading 1406 stage for processing.

The vertex shading 1406 stage processes vertex data by performing a set of operations (e.g., a vertex shader or a program) once for each of the vertices. Vertices may be, e.g., specified as a 4-coordinate vector (e.g., <x, y, z, w>) associated with one or more vertex attributes (e.g., color, texture coordinates, surface normal, etc.). The vertex shading 1406 stage may manipulate individual vertex attributes such as position, color, texture coordinates, and the like. In other words, the vertex shading 1406 stage performs operations on the vertex coordinates or other vertex attributes associated with a vertex. Such operations commonly including lighting operations (e.g., modifying color attributes for a vertex) and transformation operations (e.g., modifying the coordinate space for a vertex). For example, vertices may be specified using coordinates in an object-coordinate space, which are transformed by multiplying the coordinates by a matrix that translates the coordinates from the object-coordinate space into a world space or a normalized-device-coordinate (NCD) space. The vertex shading 1406 stage generates transformed vertex data that is transmitted to the primitive assembly 1408 stage.

The primitive assembly 1408 stage collects vertices output by the vertex shading 1406 stage and groups the vertices into geometric primitives for processing by the geometry shading 1410 stage. For example, the primitive assembly 1408 stage may be configured to group every three consecutive vertices as a geometric primitive (e.g., a triangle) for transmission to the geometry shading 1410 stage. In some embodiments, specific vertices may be reused for consecutive geometric primitives (e.g., two consecutive triangles in a triangle strip may share two vertices). The primitive assembly 1408 stage transmits geometric primitives (e.g., a collection of associated vertices) to the geometry shading 1410 stage.

The geometry shading 1410 stage processes geometric primitives by performing a set of operations (e.g., a geometry shader or program) on the geometric primitives. Tessellation operations may generate one or more geometric primitives from each geometric primitive. In other words, the geometry shading 1410 stage may subdivide each geometric primitive into a finer mesh of two or more geometric primitives for processing by the rest of the graphics processing pipeline 1400. The geometry shading 1410 stage transmits geometric primitives to the viewport SCC 1412 stage.

In an embodiment, the graphics processing pipeline 1400 may operate within a streaming multiprocessor and the vertex shading 1406 stage, the primitive assembly 1408 stage, the geometry shading 1410 stage, the fragment shading 1416 stage, and/or hardware/software associated therewith, may sequentially perform processing operations. Once the sequential processing operations are complete, in an embodiment, the viewport SCC 1412 stage may utilize the data. In an embodiment, primitive data processed by one or more of the stages in the graphics processing pipeline 1400 may be written to a cache (e.g. L1 cache, a vertex cache, etc.). In this case, in an embodiment, the viewport SCC 1412 stage may access the data in the cache. In an embodiment, the viewport SCC 1412 stage and the rasterization 1414 stage are implemented as fixed function circuitry.

The viewport SCC 1412 stage performs viewport scaling, culling, and clipping of the geometric primitives. Each surface being rendered to is associated with an abstract camera position. The camera position represents a location of a viewer looking at the scene and defines a viewing frustum that encloses the objects of the scene. The viewing frustum may include a viewing plane, a rear plane, and four clipping planes. Any geometric primitive entirely outside of the viewing frustum may be culled (e.g., discarded) because the geometric primitive will not contribute to the final rendered scene. Any geometric primitive that is partially inside the viewing frustum and partially outside the viewing frustum may be clipped (e.g., transformed into a new geometric primitive that is enclosed within the viewing frustum. Furthermore, geometric primitives may each be scaled based on a depth of the viewing frustum. All potentially visible geometric primitives are then transmitted to the rasterization 1414 stage.

The rasterization 1414 stage converts the 3D geometric primitives into 2D fragments (e.g. capable of being utilized for display, etc.). The rasterization 1414 stage may be configured to utilize the vertices of the geometric primitives to setup a set of plane equations from which various attributes can be interpolated. The rasterization 1414 stage may also compute a coverage mask for a plurality of pixels that indicates whether one or more sample locations for the pixel intercept the geometric primitive. In an embodiment, z-testing may also be performed to determine if the geometric primitive is occluded by other geometric primitives that have already been rasterized. The rasterization 1414 stage generates fragment data (e.g., interpolated vertex attributes associated with a particular sample location for each covered pixel) that are transmitted to the fragment shading 1416 stage.

The fragment shading 1416 stage processes fragment data by performing a set of operations (e.g., a fragment shader or a program) on each of the fragments. The fragment shading 1416 stage may generate pixel data (e.g., color values) for the fragment such as by performing lighting operations or sampling texture maps using interpolated texture coordinates for the fragment. The fragment shading 1416 stage generates pixel data that is transmitted to the raster operations 1418 stage.

The raster operations 1418 stage may perform various operations on the pixel data such as performing alpha tests, stencil tests, and blending the pixel data with other pixel data corresponding to other fragments associated with the pixel. When the raster operations 1418 stage has finished processing the pixel data (e.g., the output data 1402), the pixel data may be written to a render target such as a frame buffer, a color buffer, or the like.

It will be appreciated that one or more additional stages may be included in the graphics processing pipeline 1400 in addition to or in lieu of one or more of the stages described above. Various implementations of the abstract graphics processing pipeline may implement different stages. Furthermore, one or more of the stages described above may be excluded from the graphics processing pipeline in some embodiments (such as the geometry shading 1410 stage). Other types of graphics processing pipelines are contemplated as being within the scope of the present disclosure. Furthermore, any of the stages of the graphics processing pipeline 1400 may be implemented by one or more dedicated hardware units within a graphics processor such as parallel processing unit 802. Other stages of the graphics processing pipeline 1400 may be implemented by programmable hardware units such as the streaming multiprocessor 1100 of the parallel processing unit 802.

The graphics processing pipeline 1400 may be implemented via an application executed by a host processor, such as a CPU. In an embodiment, a device driver may implement an application programming interface (API) that defines various functions that can be utilized by an application in order to generate graphical data for display. The device driver is a software program that includes a plurality of instructions that control the operation of the parallel processing unit 802. The API provides an abstraction for a programmer that lets a programmer utilize specialized graphics hardware, such as the parallel processing unit 802, to generate the graphical data without requiring the programmer to utilize the specific instruction set for the parallel processing unit 802. The application may include an API call that is routed to the device driver for the parallel processing unit 802. The device driver interprets the API call and performs various operations to respond to the API call. In some instances, the device driver may perform operations by executing instructions on the CPU. In other instances, the device driver may perform operations, at least in part, by launching operations on the parallel processing unit 802 utilizing an input/output interface between the CPU and the parallel processing unit 802. In an embodiment, the device driver is configured to implement the graphics processing pipeline 1400 utilizing the hardware of the parallel processing unit 802.

Various programs may be executed within the parallel processing unit 802 in order to implement the various stages of the graphics processing pipeline 1400. For example, the device driver may launch a kernel on the parallel processing unit 802 to perform the vertex shading 1406 stage on one streaming multiprocessor 1100 (or multiple streaming multiprocessor 1100 modules). The device driver (or the initial kernel executed by the parallel processing unit 802) may also launch other kernels on the parallel processing unit 802 to perform other stages of the graphics processing pipeline 1400, such as the geometry shading 1410 stage and the fragment shading 1416 stage. In addition, some of the stages of the graphics processing pipeline 1400 may be implemented on fixed unit hardware such as a rasterizer or a data assembler implemented within the parallel processing unit 802. It will be appreciated that results from one kernel may be processed by one or more intervening fixed function hardware units before being processed by a subsequent kernel on a streaming multiprocessor 1100.

Machine Embodiments

Figure 15:
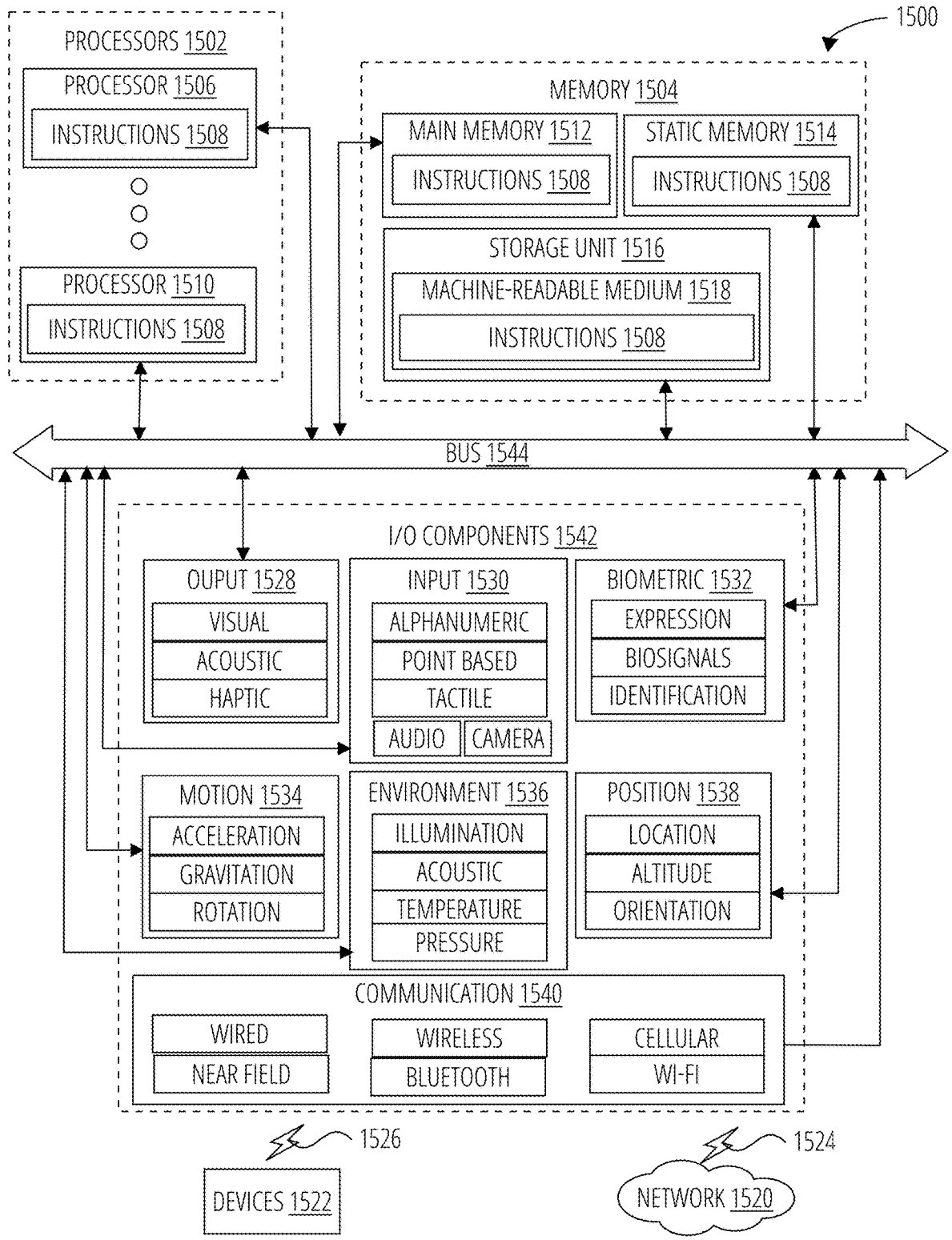
FIG. 15 illustrates a diagrammatic representation of a machine 1500 in the form of a computer system within which a set of instructions may be executed for causing the machine to perform any one or more of the methodologies discussed herein, according to an example embodiment.

FIG. 15 depicts a diagrammatic representation of a machine 1500 in the form of a computer system within which logic may be implemented to cause the machine to perform any one or more of the functions or methods disclosed herein, according to an example embodiment.

Specifically, FIG. 15 depicts a machine 1500 comprising instructions 1508 (e.g., a program, an application, an applet, an app, or other executable code) for causing the machine 1500 to execute various functions. The instructions 1508 configure a general, non-programmed machine into a particular machine 1500 programmed to carry out said functions and/or methods.

The machine 1500 includes various components (e.g., memories 1504, processors 1502) that may exchange data and/or commands in accordance with the techniques described herein.

In alternative embodiments, the machine 1500 operates as a standalone device or may be coupled (e.g., networked) to other machines. In a networked deployment, the machine 1500 may operate in the capacity of a server machine or a client machine in a server-client network environment, or as a peer machine in a peer-to-peer (or distributed) network environment. The machine 1500 may comprise, but not be limited to, a server computer, a client computer, a personal computer (PC), a tablet computer, a laptop computer, a netbook, a set-top box (STB), a PDA, an entertainment media system, a cellular telephone, a smart phone, a mobile device, a wearable device (e.g., a smart watch), a smart home device (e.g., a smart appliance), other smart devices, a web appliance, a network router, a network switch, a network bridge, or any machine capable of executing the instructions 1508, sequentially or otherwise, that specify actions to be taken by the machine 1500. Further, while only a single machine 1500 is depicted, the term "machine" shall also be taken to include a collection of machines that individually or jointly execute the instructions 1508 to perform any one or more of the methodologies or subsets thereof discussed herein.

The machine 1500 may include processors 1502, memory 1504, and I/O components 1542, which may be configured to communicate with each other such as via one or more bus 1544. In an example embodiment, the processors 1502 (e.g., a Central Processing Unit (CPU), a Reduced Instruction Set Computing (RISC) processor, a Complex Instruction Set Computing (CISC) processor, a Graphics Processing Unit (GPU), a Digital Signal Processor (DSP), an ASIC, a Radio-Frequency Integrated Circuit (RFIC), another processor, or any suitable combination thereof) may include, for example, one or more processor (e.g., processor 1506 and processor 1510) to execute the instructions 1508. The term "processor" is intended to include multi-core processors that may comprise two or more independent processors (sometimes referred to as "cores") that may execute instructions contemporaneously. Although FIG. 15 depicts multiple processors 1502, the machine 1500 may include a single processor with a single core, a single processor with multiple cores (e.g., a multi-core processor), multiple processors with a single core, multiple processors with multiples cores, or any combination thereof.

The memory 1504 may include one or more of a main memory 1512, a static memory 1514, and a storage unit 1516, each accessible to the processors 1502 such as via the bus 1544. The main memory 1512, the static memory 1514, and storage unit 1516 may be utilized, individually or in combination, to store the instructions 1508 embodying any one or more of the functionality described herein. The instructions 1508 may reside, completely or partially, within the main memory 1512, within the static memory 1514, within a machine-readable medium 1518 within the storage unit 1516, within at least one of the processors 1502 (e.g., within the processor's cache memory), or any suitable combination thereof, during execution thereof by the machine 1500.

The I/O components 1542 may include a wide variety of components to receive input, provide output, produce output, transmit information, exchange information, capture measurements, and so on. The specific I/O components 1542 that are included in a particular machine will depend on the type of machine. For example, portable machines such as mobile phones will likely include a touch input device or other such input mechanisms, while a headless server machine will likely not include such a touch input device. It will be appreciated that the I/O components 1542 may include many other components that are not shown in FIG. 15. The I/O components 1542 are grouped according to functionality merely for simplifying the following discussion and the grouping is in no way limiting. In various example embodiments, the I/O components 1542 may include output components 1528 and input components 1530. The output components 1528 may include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth. The input components 1530 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components (e.g., a microphone), one or more cameras for capturing still images and video, and the like.

In further example embodiments, the I/O components 1542 may include biometric components 1532, motion components 1534, environmental components 1536, or position components 1538, among a wide array of possibilities. For example, the biometric components 1532 may include components to detect expressions (e.g., hand expressions, facial expressions, vocal expressions, body gestures, or eye tracking), measure bio-signals (e.g., blood pressure, heart rate, body temperature, perspiration, or brain waves), identify a person (e.g., voice identification, retinal identification, facial identification, fingerprint identification, or electroencephalogram-based identification), and the like. The motion components 1534 may include acceleration sensor components (e.g., accelerometer), gravitation sensor components, rotation sensor components (e.g., gyroscope), and so forth. The environmental components 1536 may include, for example, illumination sensor components (e.g., photometer), temperature sensor components (e.g., one or more thermometers that detect ambient temperature), humidity sensor components, pressure sensor components (e.g., barometer), acoustic sensor components (e.g., one or more microphones that detect background noise), proximity sensor components (e.g., infrared sensors that detect nearby objects), gas sensors (e.g., gas detection sensors to detection concentrations of hazardous gases for safety or to measure pollutants in the atmosphere), or other components that may provide indications, measurements, or signals corresponding to a surrounding physical environment. The position components 1538 may include location sensor components (e.g., a GPS receiver component), altitude sensor components (e.g., altimeters or barometers that detect air pressure from which altitude may be derived), orientation sensor components (e.g., magnetometers), and the like.

Communication may be implemented using a wide variety of technologies. The I/O components 1542 may include communication components 1540 operable to couple the machine 1500 to a network 1520 or devices 1522 via a coupling 1524 and a coupling 1526, respectively. For example, the communication components 1540 may include a network interface component or another suitable device to interface with the network 1520. In further examples, the communication components 1540 may include wired communication components, wireless communication components, cellular communication components, Near Field Communication (NFC) components, Bluetooth® components (e.g., Bluetooth® Low Energy), Wi-Fi® components, and other communication components to provide communication via other modalities. The devices 1522 may be another machine or any of a wide variety of peripheral devices (e.g., a peripheral device coupled via a USB).

Moreover, the communication components 1540 may detect identifiers or include components operable to detect identifiers. For example, the communication components 1540 may include Radio Frequency Identification (RFID) tag reader components, NFC smart tag detection components, optical reader components (e.g., an optical sensor to detect one-dimensional bar codes such as Universal Product Code (UPC) bar code, multi-dimensional bar codes such as Quick Response (QR) code, Aztec code, Data Matrix, Dataglyph, MaxiCode, PDF417, Ultra Code, UCC RSS-2D bar code, and other optical codes), or acoustic detection components (e.g., microphones to identify tagged audio signals). In addition, a variety of information may be derived via the communication components 1540, such as location via Internet Protocol (IP) geolocation, location via Wi-Fi® signal triangulation, location via detecting an NFC beacon signal that may indicate a particular location, and so forth.

Instruction and Data Storage Medium Embodiments

The various memories (i.e., memory 1504, main memory 1512, static memory 1514, and/or memory of the processors 1502) and/or storage unit 1516 may store one or more sets of instructions and data structures (e.g., software) embodying or utilized by any one or more of the methodologies or functions described herein. These instructions (e.g., the instructions 1508), when executed by processors 1502, cause various operations to implement the disclosed embodiments.

As used herein, the terms "machine-storage medium," "device-storage medium," "computer-storage medium" mean the same thing and may be used interchangeably in this disclosure. The terms refer to a single or multiple storage devices and/or media (e.g., a centralized or distributed database, and/or associated caches and servers) that store executable instructions and/or data. The terms shall accordingly be taken to include, but not be limited to, solid-state memories, and optical and magnetic media, including memory internal or external to processors and internal or external to computer systems. Specific examples of machine-storage media, computer-storage media and/or device-storage media include non-volatile memory, including by way of example semiconductor memory devices, e.g., erasable programmable read-only memory (EPROM), electrically erasable programmable read-only memory (EEPROM), FPGA, and flash memory devices; magnetic disks such as internal hard disks and removable disks; magneto-optical disks; and CD-ROM and DVD-ROM disks. The terms "machine-storage media," "computer-storage media," and "device-storage media" specifically exclude carrier waves, modulated data signals, and other such intangible media, at least some of which are covered under the term "signal medium" discussed below.

Some aspects of the described subject matter may in some embodiments be implemented as computer code or machine-useable instructions, including computer-executable instructions such as program modules, being executed by a computer or other machine, such as a personal data assistant or other handheld device. Generally, program modules including routines, programs, objects, components, data structures, etc., refer to code that perform particular tasks or implement particular data structures in memory. The subject matter of this application may be practiced in a variety of system configurations, including hand-held devices, consumer electronics, general-purpose computers, more specialty computing devices, etc. The subject matter may also be practiced in distributed computing environments where tasks are performed by remote-processing devices that are linked through a communications network.

Communication Network Embodiments

In various example embodiments, one or more portions of the network 1520 may be an ad hoc network, an intranet, an extranet, a VPN, a LAN, a WLAN, a WAN, a WWAN, a MAN, the Internet, a portion of the Internet, a portion of the PSTN, a plain old telephone service (POTS) network, a cellular telephone network, a wireless network, a Wi-Fi® network, another type of network, or a combination of two or more such networks. For example, the network 1520 or a portion of the network 1520 may include a wireless or cellular network, and the coupling 1524 may be a Code Division Multiple Access (CDMA) connection, a Global System for Mobile communications (GSM) connection, or another type of cellular or wireless coupling. In this example, the coupling 1524 may implement any of a variety of types of data transfer technology, such as Single Carrier Radio Transmission Technology (1×RTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks, Universal Mobile Telecommunications System (UMTS), High Speed Packet Access (HSPA), Worldwide Interoperability for Microwave Access (WiMAX), Long Term Evolution (LTE) standard, others defined by various standard-setting organizations, other long range protocols, or other data transfer technology.

The instructions 1508 and/or data generated by or received and processed by the instructions 1508 may be transmitted or received over the network 1520 using a transmission medium via a network interface device (e.g., a network interface component included in the communication components 1540) and utilizing any one of a number of well-known transfer protocols (e.g., hypertext transfer protocol (HTTP)). Similarly, the instructions 1508 may be transmitted or received using a transmission medium via the coupling 1526 (e.g., a peer-to-peer coupling) to the devices 1522. The terms "transmission medium" and "signal medium" mean the same thing and may be used interchangeably in this disclosure. The terms "transmission medium" and "signal medium" shall be taken to include any intangible medium that is capable of storing, encoding, or carrying the instructions 1508 for execution by the machine 1500, and/or data generated by execution of the instructions 1508, and/or data to be operated on during execution of the instructions 1508, and includes digital or analog communications signals or other intangible media to facilitate communication of such software. Hence, the terms "transmission medium" and "signal medium" shall be taken to include any form of modulated data signal, carrier wave, and so forth. The term "modulated data signal" means a signal that has one or more of its characteristics set or changed in such a matter as to encode information in the signal.

Figure 16:
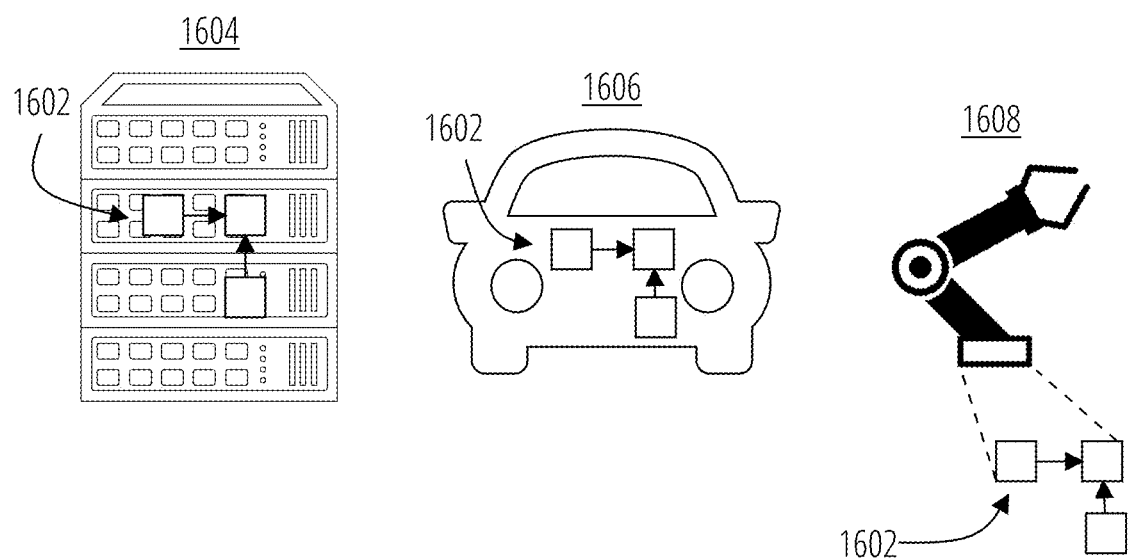
FIG. 16 depicts a circuit system 1602 in accordance with one embodiment.

FIG. 16 depicts exemplary scenarios for use of a circuit system 1602 in accordance with some embodiments. A circuit system 1602 may be utilized in a computing system 1604 (e.g., a data center computer or computers), a vehicle 1606, and a robot 1608, to name just a few examples. The circuit system 1602 may comprise a transmitter communicating data and/or instructions to a receiver, for example.

---

CODE LISTINGS

MTA DQ encoder

```
//Polarities below represent VDD term and will likely be modified
for GND term, but the code below gives a sense of the logic needed
for encoder
module mta_enc_dq_7_to_8 (input logic [6:0] x, output logic [7:0]
y);
logic [7:0] temp;
always_comb begin
    y = {x[6],1'b1,x[5:0]};
    if (x[6:2] == 5'b0_00_10) y[7:2] = 6'b10_01_01;
    if (x[6:2] == 5'b0_10_00) y[7:2] = 6'b10_01_11;
    if (x[6:2] == 5'b1_00_10) y[7:2] = 6'b10_10_01;
    if (x[6:2] == 5'b1_10_00) y[7:2] = 6'b10_10_11;
    if (x == 7'b0_00_00_10) y = 8'b10_11_00_01;
    if (x == 7'b0_01_00_10) y = 8'b10_11_00_11;
    if (x == 7'b0_01_10_00) y = 8'b10_11_01_00;
    if (x == 7'b0_11_00_10) y = 8'b10_11_01_01;
    if (x == 7'b0_11_10_00) y = 8'b10_11_01_11;
    if (x == 7'b0_10_10_00) y = 8'b10_11_01_10;
    if (x == 7'b1_10_10_00) y = 8'b10_11_11_00;
    if (x == 7'b1_11_10_00) y = 8'b10_11_11_01;
    if (x == 7'b1_11_00_10) y = 8'b10_11_11_11;
    if (x == 7'b1_01_10_00) y = 8'b10_11_11_10;
    if (x == 7'b1_01_00_10) y = 8'b10_11_10_01;
    if (x == 7'b1_00_00_10) y = 8'b10_11_10_11;
    // Reverse symbol order so that we can send LSBs first
    temp = y;
    y[1:0] = temp[7:6];
    y[3:2] = temp[5:4];
    y[5:4] = temp[3:2];
    y[7:6] = temp[1:0];
end
endmodule
```

MTA DQ decoder

```
//Polarities below represent VDD term and will likely be modified
for GND term, but the code below gives a sense of the logic needed
for encoder
module mta_dec_dq_8_to_7 (input logic [7:0] x, output logic [6:0]
y);
logic [7:0] x_rev;
// First reverse the symbol order because MSB first is easier to
work with.
always_comb begin
    x_rev[1:0] = x[7:6];
    x_rev[3:2] = x[5:4];
    x_rev[5:4] = x[3:2];
    x_rev[7:6] = x[1:0];
    y = {x_rev[7],x_rev[5:0]};
    if (x_rev[7:2] == 6'b10_01_01) y[6:2] = 5'b0_00_10;
    if (x_rev[7:2] == 6'b10_01_11) y[6:2] = 5'b0_10_00;
    if (x_rev[7:2] == 6'b10_10_01) y[6:2] = 5'b1_00_10;
    if (x_rev[7:2] == 6'b10_10_11) y[6:2] = 5'b1_10_00;
    if (x_rev == 8'b10_11_00_01) y = 7'b0_00_00_10;
    if (x_rev == 8'b10_11_00_11) y = 7'b0_01_00_10;
    if (x_rev == 8'b10_11_01_00) y = 7'b0_01_10_00;
    if (x_rev == 8'b10_11_01_01) y = 7'b0_11_00_10;
    if (x_rev == 8'b10_11_01_11) y = 7'b0_11_10_00;
    if (x_rev == 8'b10_11_01_10) y = 7'b0_10_10_00;
    if (x_rev == 8'b10_11_11_00) y = 7'b1_10_10_00;
    if (x_rev == 8'b10_11_11_01) y = 7'b1_11_10_00;
    if (x_rev == 8'b10_11_11_11) y = 7'b1_11_00_10;
    if (x_rev == 8'b10_11_11_10) y = 7'b1_01_10_00;
    if (x_rev == 8'b10_11_10_01) y = 7'b1_01_00_10;
    if (x_rev == 8'b10_11_10_11) y = 7'b1_00_00_10;
end
endmodule
```

---

CODE LISTINGS

MTA EDC encoder

```
module mta_enc_edc_24_to_32 (input logic [23:0] x, output logic
[31:0] y);
// First reverse the symbol order because MSB first is easier to
work with.
always_comb begin
    y[1:0] = x[1:0];
    y[3:2] = edc_odd_symbol_enc(x[2]);
    y[5:4] = x[4:3];
    y[7:6] = edc_odd_symbol_enc(x[5]);
    y[9:8] = x[7:6];
    y[11:10] = edc_odd_symbol_enc(x[8]);
    y[13:12] = x[10:9];
    y[15:14] = edc_odd_symbol_enc(x[11]);
    y[17:16] = x[13:12];
    y[19:18] = edc_odd_symbol_enc(x[14]);
    y[21:20] = x[16:15];
    y[23:22] = edc_odd_symbol_enc(x[17]);
    y[25:24] = x[19:18];
    y[27:26] = edc_odd_symbol_enc(x[20]);
    y[29:28] = x[22:21];
    y[31:30] = edc_odd_symbol_enc(x[23]);
end
function [1:0] edc_odd_symbol_enc; // output is active low
    input edc_bit;
    begin
        edc_odd_symbol_enc = edc_bit ? 2'b11 : 2'b01; // Use the 2-
middle voltages to avoid max transitions
    end
endfunction
endmodule
```

MTA EDC decoder

```
module mta_dec_edc_32_to_24 (input logic [31:0] x,output logic
[23:0] y);
// First reverse the symbol order because MSB first is easier to
work with.
always_comb begin
    y[1:0] = x[1:0];
    y[2] = edc_odd_symbol_dec(x[3:2]);
    y[4:3] = x[5:4];
    y[5] = edc_odd_symbol_dec(x[7:6]);
    y[7:6] = x[9:8];
    y[8] = edc_odd_symbol_dec(x[11:10]);
    y[10:9] = x[13:11];
    y[11] = edc_odd_symbol_dec(x[15:14]);
    y[13:12] = x[17:16];
    y[14] = edc_odd_symbol_dec(x[19:18]);
    y[16:15] = x[21:20];
    y[17] = edc_odd_symbol_dec(x[23:22]);
    y[19:18] = x[25:24];
    y[20] = edc_odd_symbol_dec(x[27:26]);
    y[22:21] = x[29:28];
    y[23] = edc_odd_symbol_dec(x[31:30]);
end
function edc_odd_symbol_dec; // output is active low
    input [1:0] edc_symbol;
    begin
        edc_odd_symbol_dec = (edc_symbol[1] == 1) ? 1 : 0; // Use the
2-middle voltages to avoid max transitions - LSB is don't care
    end
endfunction
endmodule
```

---

LISTING OF DRAWING ELEMENTS

100 machine memory system
102 CRC checker
104 DQ/DQX MTA decoder
106 DRAM
108 EDC MTA decoder
110 CRC generator
112 DQ/DQX MTA encoder
114 EDC MTA encoder
200 burst read system
202 data burst 204 PAM-4 encodings
206 hybrid PAM-4 encoding
302 transmitter
304 receiver
400 7-8 bit encoding
402 raw data
404 encoded data
500 32-bit data burst
502 EDC data stream
600 DQ/DQX encoding
602 CRC low-bits generator
604 CRC high-bits generator
700 EDC encoding
802 parallel processing unit
804 I/O unit
806 front-end unit
808 scheduler unit
810 work distribution unit
812 hub
814 crossbar
816 NVLink
818 interconnect
820 memory
900 general processing cluster
902 pipeline manager
904 pre-raster operations unit
906 raster engine
908 work distribution crossbar
910 memory management unit
912 data processing cluster
914 primitive engine
916 M-pipe controller
1000 memory partition unit
1002 raster operations unit
1004 level two cache
1006 memory interface
1100 streaming multiprocessor
1102 instruction cache
1104 scheduler unit
1106 register file
1108 core
1110 special function unit
1112 load/store unit
1114 interconnect network
1116 shared memory/L1 cache
1118 dispatch
1200 processing system
1202 central processing unit
1204 switch
1206 parallel processing module
1300 exemplary processing system
1302 communications bus
1304 main memory
1306 input devices
1308 display devices
1310 network interface
1400 graphics processing pipeline
1402 output data
1404 data assembly
1406 vertex shading
1408 primitive assembly
1410 geometry shading
1412 viewport SCC
1414 rasterization
1416 fragment shading
1418 raster operations
1420 input data
1500 machine
1502 processors
1504 memory
1506 processor
1508 instructions
1510 processor
1512 main memory
1514 static memory
1516 storage unit
1518 machine-readable medium
1520 network
1522 devices
1524 coupling
1526 coupling
1528 output components
1530 input components
1532 biometric components
1534 motion components
1536 environmental components
1538 position components
1540 communication components
1542 I/O components
1544 bus
1602 circuit system
1604 computing system
1606 vehicle
1608 robot Various functional operations described herein may be implemented in logic that is referred to using a noun or noun phrase reflecting said operation or function. For example, an association operation may be carried out by an "associator" or "correlator". Likewise, switching may be carried out by a "switch", selection by a "selector", and so on.

Within this disclosure, different entities (which may variously be referred to as "units," "circuits," other components, etc.) may be described or claimed as "configured" to perform one or more tasks or operations. This formulation-[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

As used herein, a recitation of "and/or" with respect to two or more elements should be interpreted to mean only one element, or a combination of elements. For example, "element A, element B, and/or element C" may include only element A, only element B, only element C, element A and element B, element A and element C, element B and element C, or elements A, B, and C. In addition, "at least one of element A or element B" may include at least one of element A, at least one of element B, or at least one of element A and at least one of element B. Further, "at least one of element A and element B" may include at least one of element A, at least one of element B, or at least one of element A and at least one of element B.

The subject matter of the present disclosure is described with specificity herein to meet statutory requirements. However, the description itself is not intended to limit the scope of this disclosure. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

Having thus described illustrative embodiments in detail, it will be apparent that modifications and variations are possible without departing from the scope of the invention as claimed. The scope of inventive subject matter is not limited to the depicted embodiments but is rather set forth in the following Claims.

What is claimed is:

1. A transmitter comprising:
  a first encoder configured to:
    generate first symbols on a plurality of data channels by applying pulse amplitude N-level modulation (PAM-N) encoding on a first subset of bits of a data burst, the first symbols generated without maximum transitions between the first symbols; and
    generate second symbols on at least one optionally-activated additional data channel, the second symbols generated by applying the PAM-N encoding on a second subset of bits of the data burst, the second symbols generated without maximum transitions between the second symbols; and
  a second encoder configured to:
  generate third symbols on a channel for communicating error correction bits for the first subset of bits and the second subset of bits, the third symbols generated by applying hybrid PAM-N encoding on the error correction bits and a third subset of bits of the data burst, the hybrid PAM-N encoding comprising an interleaving of symbols with N voltage levels and symbols with less than N voltage levels.

2. The transmitter of claim 1, wherein N=4.

3. The transmitter of claim 2, wherein the hybrid PAM-N encoding on the error correction bits and a third subset of bits of the data burst comprises:
  PAM-4 encoding of the error correction bits interleaved with a (+1, −1) encoding of the third subset of bits.

4. The transmitter of claim 1, wherein N=8.

5. The transmitter of claim 4, wherein the hybrid PAM-N encoding on the error correction bits and a third subset of bits of the data burst comprises:
  PAM-8 encoding of the error correction bits interleaved with one or more of a (+3, +1, −1, −3) and a (+1, −1) encoding of the third subset of bits.

6. A method comprising:
  encoding seven bits of a first eight-bit data value as a first set of four PAM-4 symbols on a first serial data line;
  encoding seven bits of a second eight-bit data value as a second set of four PAM-4 symbols on the first serial data line; and
  encoding one bit of the first eight-bit data value and one bit of the second eight-bit data value that were not encoded in the first set of four PAM-4 symbols and the second set of four PAM-4 symbols, respectively, as a first PAM-4 symbol on a second serial data line;
  encoding error correction bits for the first eight-bit data value and the second eight-bit data value as PAM-4 symbols on a channel dedicated to communicating error correction bits; and
  encoding one bit of a third eight-bit data value as a (+1, −1) symbol on the channel dedicated to communicating error correction bits.

7. The method of claim 6, further comprising:
  encoding seven bits of a third eight-bit data value as a third set of four PAM-4 symbols on a third serial data line;
  encoding seven bits of a fourth eight-bit data value as a fourth set of four PAM-4 symbols on the third serial data line;
  encoding one bit of the third eight-bit data value and one bit of the fourth eight-bit data value that were not encoded in the third set of four PAM-4 symbols and the fourth set of four PAM-4 symbols, respectively, as a second PAM-4 symbol on the second serial data line.

8. The method of claim 6, wherein the one bit of the first eight-bit data value and the one bit of the second eight-bit data value are a least significant bit of the first eight-bit data value and a least significant bit of the second eight-bit data value, respectively.

9. The method of claim 6, wherein the one bit of the first eight-bit data value and the one bit of the second eight-bit data value are a most significant bit of the first eight-bit data value and a most significant bit of the second eight-bit data value, respectively.

10. The method of claim 6, wherein the seven bits of the first eight-bit data value and the seven bits of the second eight-bit data value are each encoded as PAM-4 codewords that do not have internal −3 to +3 transitions and that comprise a pattern of (+3,+1, −1) or (−3,−1,+1).

11. The method of claim 6, further comprising:
inverting the encoding of the seven bits of the second eight-bit data value on condition that a most significant bit (MSB) of the encoding of the seven bits of the first eight-bit data value is 1.

12. A system comprising:
a transmitter;
a receiver;
a bus coupling the the transmitter to the receiver, the bus comprising:
at least one set of eight parallel data channels;
an auxiliary data channel per each set of eight parallel data channels; and
an error correction channel per each set of eight parallel data channels; and
logic configured to communicate every $8^{th}$ bit of data from seven of the eight parallel data channels in a 32-bit data burst on the auxiliary data channel and to communicate every $8^{th}$ bit of data from an eighth parallel data channel on the error correction channel.

13. The system of claim 12, wherein the logic is further configured to:
separate twenty-eight bits of the 32-bit data burst into four 7-bit streams, wherein each stream is encoded into PAM-4 symbols and the PAM-4 symbols form an 8-bit codeword that avoids PAM-4 maximum transitions within codewords and between codewords.

14. The system of claim 13, wherein the logic is further configured to:
invert a current codeword to transmit, or leave the current codeword unmodified, based on a last symbol in a previously transmitted codeword.

15. The system of claim 12, wherein the logic is further configured to:
on the error correction channel, communicate a combination of PAM-4 symbols encoding 2-bits and 1-bit.

16. The system of claim 15, wherein the logic is further configured to:
on alternate unit intervals of the error correction channel, encode 2-bits as a (+3,+1,−1,−3) symbol and 1-bit as a (+1,−1) symbol.

17. The system of claim 12, wherein the logic is further configured to:
communicate, on the error correction channel, 4-bits from the eighth data channel, 18-bits of an error correction code, and two 1-bit error flags within a burst interval.

18. The system of claim 17, wherein the logic is further configured to generate the error correction code on the error correction channel, the error correction code comprising 9-bits of cyclic redundancy check (CRC) generated for even symbols and another 9-bits of CRC generated for odd symbols.

19. A method comprising:
in a system comprising a data bus comprising at least one set of eight parallel data channels, an auxiliary data channel per each set of eight parallel data channels, and an error correction channel per each set of eight parallel data channels:
communicating every $8^{th}$ bit of data from seven of the eight parallel data channels in a 32-bit data burst on the auxiliary data channel; and
communicating every $8^{th}$ bit of data from an eighth parallel data channel on the error correction channel.

20. The method of claim 19, further comprising:
separating twenty-eight bits of the 32-bit data burst into four 7-bit streams, wherein each stream is encoded into PAM-4 symbols and the PAM-4 symbols form an 8-bit codeword that avoids PAM-4 maximum transitions within codewords and between codewords.

21. The method of claim 20, further comprising:
inverting a current codeword to transmit, or leaving the current codeword unmodified, based on a last symbol in a previously transmitted codeword.

22. The method of claim 21, further comprising:
on the error correction channel, communicating a combination of PAM-4 symbols encoding 2-bits and 1-bit.

23. The method of claim 22, further comprising:
on alternate unit intervals of the error correction channel, encoding 2-bits as a (+3,+1,−1,−3) symbol and 1-bit as a (+1,−1) symbol.

24. The method of claim 19, further comprising:
communicating, on the error correction channel, 4-bits from the eighth data channel, 18-bits of an error correction code, and two 1-bit error flags within a burst interval.

25. The method of claim 24, further comprising:
generating the error correction code on the error correction channel, the error correction code comprising 9-bits of cyclic redundancy check (CRC) generated for even symbols and another 9-bits of CRC generated for odd symbols.

\* \* \* \* \*